(12) United States Patent
Kimura et al.

(10) Patent No.: US 7,459,177 B2
(45) Date of Patent: Dec. 2, 2008

(54) METHOD OF MANUFACTURING COLOR FILTER SUBSTRATE, METHOD OF MANUFACTURING ELECTRO-OPTICAL DEVICE, ELECTRO-OPTICAL DEVICE, AND ELECTRONIC APPARATUS

(75) Inventors: Hideyuki Kimura, Suwa (JP); Shunichi Seki, Suwa (JP); Naoki Yamamoto, Chino (JP)

(73) Assignee: Seiko Epson Corporation, Tokyo (JP)

( * ) Notice: Subject to any disclaimer, the term of this patent is extended or adjusted under 35 U.S.C. 154(b) by 627 days.

(21) Appl. No.: 11/119,751

(22) Filed: May 3, 2005

(65) Prior Publication Data

US 2005/0260335 A1 Nov. 24, 2005

(30) Foreign Application Priority Data

May 19, 2004 (JP) ............................. 2004-149168
Mar. 29, 2005 (JP) ............................. 2005-095183

(51) Int. Cl.
*B05D 5/06* (2006.01)
(52) U.S. Cl. ...................... 427/162; 427/421.1; 257/40
(58) Field of Classification Search ................ 427/162, 427/421.1; 257/40
See application file for complete search history.

(56) References Cited

U.S. PATENT DOCUMENTS

| 6,784,459 | B2 | 8/2004 | Seki et al. |
| 6,924,593 | B2 | 8/2005 | Seki et al. |
| 7,186,581 | B2 | 3/2007 | Seki et al. |
| 2002/0064966 | A1 | 5/2002 | Seki et al. |
| 2002/0150679 | A1* | 10/2002 | Minami et al. ............... 427/240 |
| 2005/0100690 | A1* | 5/2005 | Mayer et al. .................. 428/34 |
| 2005/0264186 | A1 | 12/2005 | Seki et al. |
| 2005/0264187 | A1 | 12/2005 | Seki et al. |
| 2007/0018152 | A1 | 1/2007 | Seki et al. |

FOREIGN PATENT DOCUMENTS

| JP | A 6-214110 | 8/1994 |
| JP | A 9-325206 | 12/1997 |
| JP | A-2001-188117 | 7/2001 |
| JP | B2 3328297 | 7/2002 |
| JP | A-2002-222695 | 8/2002 |
| JP | A 2002-252083 | 9/2002 |
| JP | A 2002-318307 | 10/2002 |
| JP | A 2004-087508 | 3/2004 |
| JP | A 2004-087509 | 3/2004 |

* cited by examiner

*Primary Examiner*—Alain L Bashore
(74) *Attorney, Agent, or Firm*—Oliff & Berridge, PLC

(57) ABSTRACT

The color filter substrate has a functional region which includes a plurality of colored layers and which functions as a color filter selectively transmitting predetermined color light components and a non-functional region other than the functional region. The method includes discharging, onto a substrate, a liquid material, in which coloring materials constituting the colored layers are dissolved or dispersed into a solvent, with a liquid droplet discharge method. In the discharging of the liquid material, the liquid material is discharged onto the functional region and the liquid material or the solvent is discharged onto the non-functional region. The amount of the solvent discharged onto the non-functional region per unit area is larger than the amount of the solvent discharged onto the functional region per unit area.

4 Claims, 25 Drawing Sheets

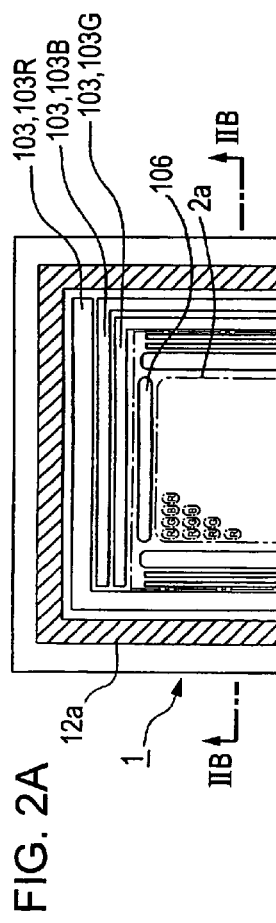
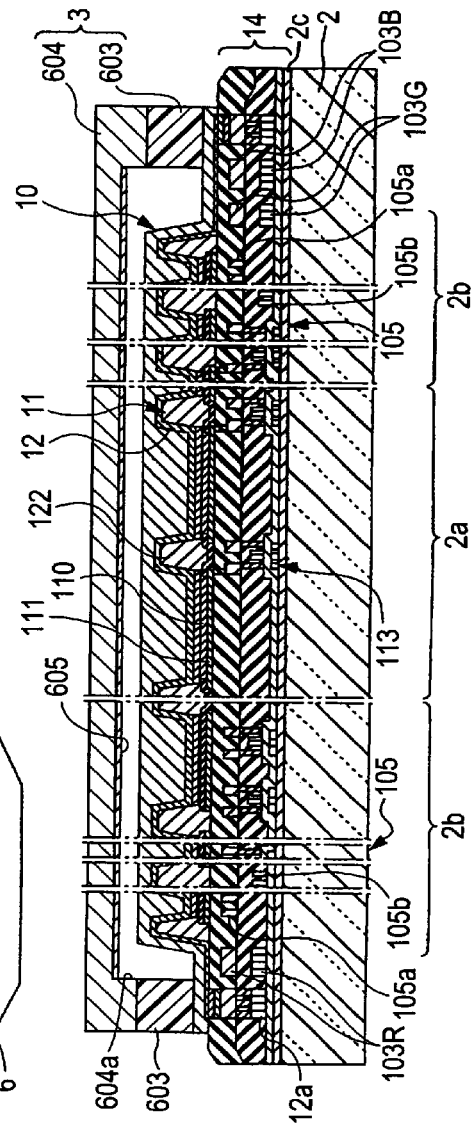
FIG. 2A
FIG. 2B

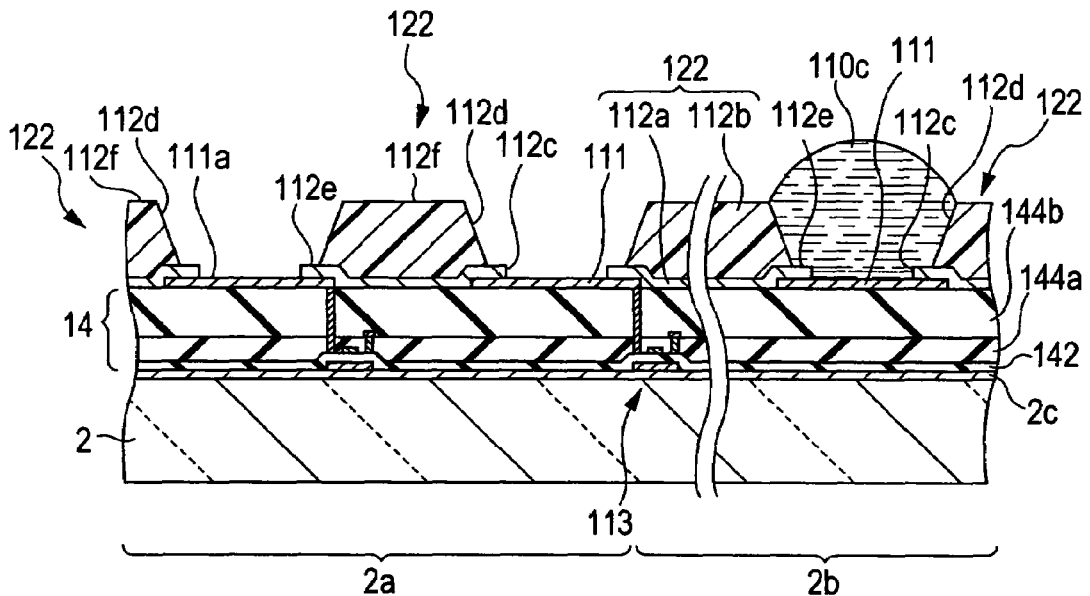
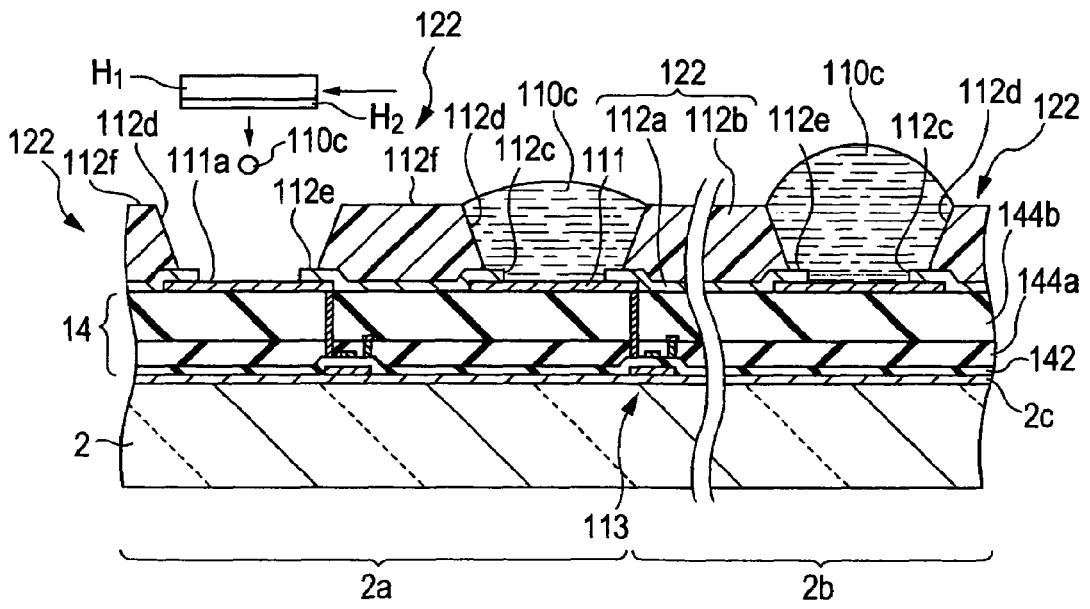

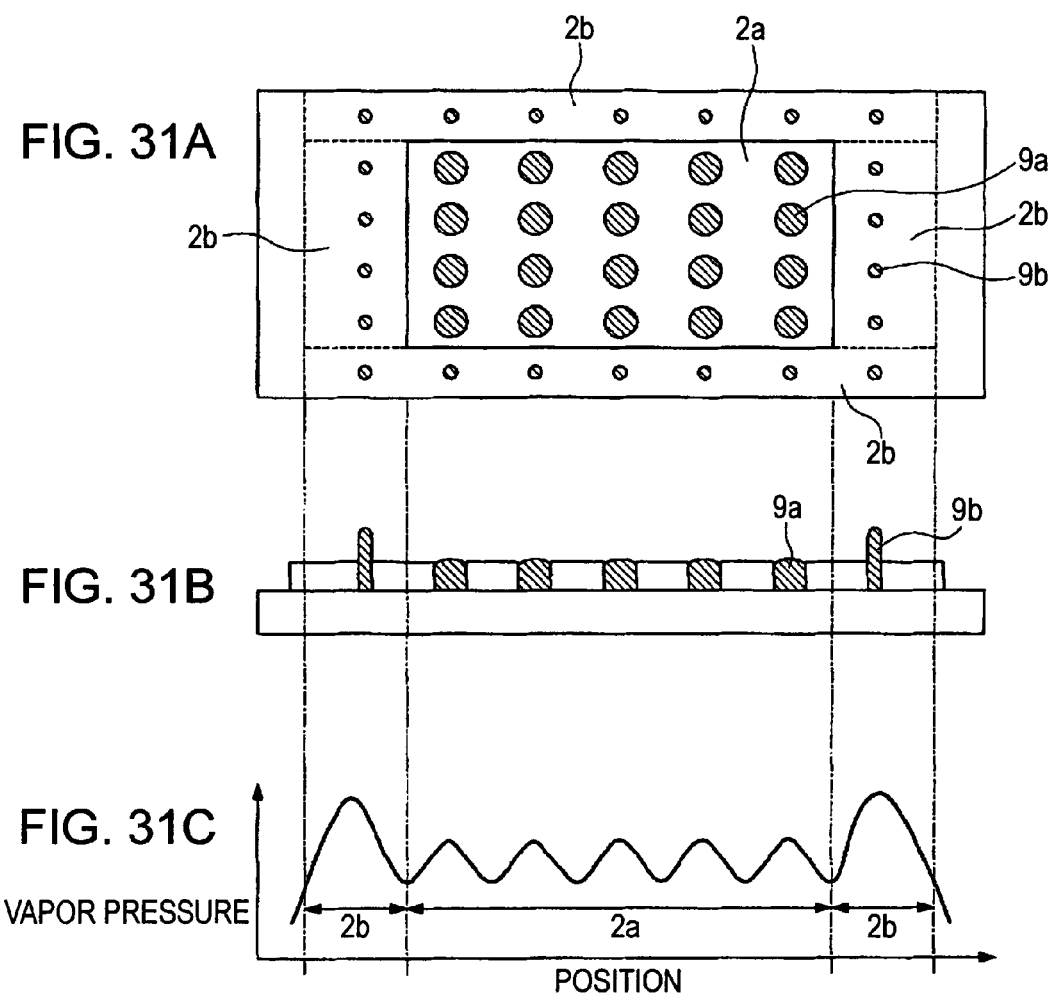

METHOD OF MANUFACTURING COLOR FILTER SUBSTRATE, METHOD OF MANUFACTURING ELECTRO-OPTICAL DEVICE, ELECTRO-OPTICAL DEVICE, AND ELECTRONIC APPARATUS

BACKGROUND OF THE INVENTION

1. Technical Field

The present invention relates to a method of manufacturing a color filter substrate, to a method of manufacturing an electro-optical device, to an electro-optical device, and to an electronic apparatus.

2. Related Art

Recently, an electro-optical device in which a functional layer made of a functional material is disposed between a pair of electrodes has been developed. In this case, in order to pattern the functional material, a liquid droplet discharge method in which the functional material, such as an organic fluorescent material, is made as ink and the resultant ink (composition) is discharged onto a base substrate is adopted. In particular, an organic electroluminescent (EL) device in which an organic light emitting material is used as the functional material has been developed.

As the method of patterning the above-described functional material, a method is adopted in which a partition wall is formed around a pixel electrode, made of ITO, formed on the base substrate, the pixel electrode and a part of the partition wall adjacent to the pixel electrode are subjected to a lyophilic treatment, the remainder of the partition wall is subjected to a liquid repellency treatment, and the ink containing the material for the functional layer is discharged and dried to form the functional layer on the pixel electrode. Specifically, there is known a method in which a liquid droplet discharge head having a nozzle array in which a plurality of nozzles are arranged in a subscanning direction is used. According to this method, when the liquid droplet discharge head is scanned in a main scanning direction with respect to a substrate, the ink is discharged from the nozzles, such that the functional layer is formed on the pixel electrode. In this method, the liquid droplets in micro order can be arranged on pixel regions. In view of utilization efficiency of the material, the liquid droplet discharge method is effective as compared to a spin coating method or the like.

However, in a peripheral portion from a display region having the pixel regions, the partial pressure of solvent molecules evaporated from a base substrate tends to be smaller than that in a central portion of the display region. If such a phenomenon occurs, the evaporation speed of the solvent in the peripheral portion is much faster. As a result, irregularity in film thickness of the functional layer may occur in the electro-optical device. In the electro-optical device having such irregularity in film thickness, electro-optical characteristics are degraded. Further, when the electro-optical device is used in a display device or the like, display irregularity may occur. Therefore, in order to solve this problem, for example, a technique is disclosed, as described in Japanese Unexamined Patent Application No. 2002-252083.

In the technique disclosed in Japanese Unexamined Patent Application No. 2002-252083, a dummy region, which is not for display, is formed outside the peripheral portion and the same ink as that of the functional layer is coated on the dummy region. Accordingly, irregularity in film thickness of the central portion and the peripheral portion of the display region is prevented or suppressed from being caused. However, even when the dummy region is formed and, like the display region, the ink is coated on the dummy region, irregularity in film thickness may not be dissolved sufficiently. That is, even when the ink is coated on the dummy region, in the peripheral portion of the display region, the solvent may be dried faster than in the central portion. Accordingly, irregularity in film thickness may not be prevented from occurring.

SUMMARY

An advantage of the invention is that it provides a method of manufacturing a color filter substrate which is capable of forming coloring patterns having a uniform film thickness on the surface thereof and a method of manufacturing an electro-optical device which is capable of forming pixel patterns having a uniform film thickness. Further, another advantage of the invention is that it provides an electro-optical device which is manufactured by such a manufacturing method and an electronic apparatus having the electro-optical device.

According to a first aspect of the invention, there is provided a method of manufacturing a color filter substrate which has a functional region including a plurality of colored layers and functioning as a color filter to selectively transmit predetermined color light components and a non-functional region other than the functional region. The method of manufacturing a color filter substrate includes discharging, onto a substrate, a liquid material, in which coloring materials constituting the colored layers are dissolved or dispersed into a solvent, with a liquid droplet discharge method. In the discharging of the liquid material, the liquid material is discharged onto the functional region and the liquid material or the solvent is discharged onto the non-functional region. The amount of the solvent discharged onto the non-functional region per unit area is larger than the amount of the solvent discharged onto the functional region per unit area.

In accordance with the first aspect of the invention, the amount of the solvent discharged onto the non-functional region per unit area is larger than the amount of the solvent discharged onto the functional region per unit area. Thus, when the solvent is dried after being discharged, the partial pressure of solvent particles to be evaporated in the functional region is not extremely larger than the partial pressure of the solvent particles to be evaporated in the non-functional region. For this reason, the evaporation speed of the solvent in the non-functional region can approximate to the evaporation speed of the solvent in the functional region. Therefore, the evaporation speed of the solvent in the peripheral portion of the functional region can approximate to the evaporation speed of the solvent in the central portion. As a result, the colored layers having the same thickness can be formed further uniformly in the peripheral portion and the central portion. Then, in this case, it is possible to provide a color filter substrate having small color irregularity and excellent reliability in the entire functional region, in particular, irregardless of the central portion or the peripheral portion.

According to a second aspect of the invention, there is provided a method of manufacturing an electro-optical device which has a functional region in which electro-optical elements of pixels function and a non-functional region which is formed around the functional region. The method of manufacturing an electro-optical device includes discharging, onto a substrate, a liquid material, in which functional materials constituting the electro-optical elements are dissolved or dispersed into a solvent, with a liquid droplet discharge method. In the discharging of the liquid material, the liquid material is discharged onto the functional region and the liquid material or the solvent is discharged onto the non-functional region. The amount of the solvent discharged onto the non-functional region per unit area is larger than the amount of the solvent discharged onto the functional region per unit area.

In accordance with the second aspect of the invention, the amount of the solvent discharged onto the non-functional region per unit area is larger than the amount of the solvent discharged onto the functional region per unit area. Thus, when the solvent is dried after being discharged, the partial pressure of solvent particles to be evaporated in the functional region is not extremely larger than the partial pressure of the solvent particles to be evaporated in the non-functional region. For this reason, the evaporation speed of the solvent in the non-functional region can approximate to the evaporation speed of the solvent in the functional region. Therefore, the evaporation speed of the solvent in the peripheral portion of the functional region can approximate to the evaporation speed of the solvent in the central portion. As a result, layers constituting an electro-optical element (electro-optical device element layers) having the same thickness can be formed further uniformly in the peripheral portion and the central portion. Then, in this case, it is possible to provide an electro-optical device having small irregularity in element characteristic and excellent reliability in the entire functional region, in particular, irregardless of the central portion or the peripheral portion.

The method of manufacturing an electro-optical device may further include, before the discharging of the liquid material, forming liquid holding regions in which the liquid material and/or the solvent are discharged in the same pattern (that is, in the respective regions, the patterns having the same shape and the same area are formed at regular intervals) onto the functional region and the non-functional region on the substrate, respectively. In this case, in the discharging of the liquid material, the amount of the solvent discharged onto the liquid holding region of the non-functional region may be larger than the amount of the solvent discharged onto the liquid holding region of the functional region. In such a manner, the amount of the solvent discharged onto the non-functional region per unit area can be larger than the amount of the solvent discharged onto the functional region per unit area. As a result, the advantages of the invention can be properly realized.

On the other hand, the method of manufacturing an electro-optical device may further include, before the discharging of the liquid material, forming liquid holding regions in which the liquid material and/or the solvent are discharged onto the functional region and the non-functional region on the substrate, respectively. In this case, in the forming of the liquid holding regions, an area of the liquid holding region in the functional region can be formed larger than an area of the liquid holding region in the non-functional region. As such, the area of the liquid holding region in the non-functional region is enlarged and thus the amount of the solvent discharged onto the non-functional region per unit area can be properly larger than that in the functional region.

Alternatively, the method of manufacturing an electro-optical device may further include, before the discharging of the liquid material, forming liquid holding regions in which the liquid material and/or the solvent are discharged onto the functional region and the non-functional region on the substrate. The functional region may be rectangular in plan view and a density of the liquid holding region in the non-functional region may be different in the longitudinal and traverse directions of the functional region. The amount of the solvent discharged onto the liquid holding region having a large density in the non-functional region per unit area may be larger than the amount of the solvent discharged onto the liquid holding region having a small density in the non-functional region per unit area. If the density of the liquid holding region is large, adjacent liquid holding regions is likely to interfere with each other. Thus, it is preferable that the amount of the solvent discharged onto the liquid holding region having the large density becomes large.

Further, when the functional region is rectangular in plan view, with respect to a first non-functional region formed in a traverse direction of the functional region and a second non-functional region formed in a longitudinal direction of the functional region, in the discharging of the liquid material, the amount of the solvent-discharged onto the first non-functional region per unit area may be larger than the amount of the solvent discharged onto the second non-functional region per unit area. That is, from the first non-functional region and the second non-functional region, the amount of the solvent in the first non-functional region which is spaced away from the central portion of the functional region becomes relatively large. Then, the evaporation speed of the solvent in the central portion of the functional region can approximate to the evaporation speed of the solvent in the non-functional region. As a result, in the functional region which is formed to be rectangular in plan view, the film thickness of the electro-optical element layer can be made uniform.

Further, the method of manufacturing an electro-optical device may further include, before the discharging of the liquid material, forming liquid holding regions in which the liquid material and/or the solvent are discharged onto the functional region and the non-functional region on the substrate. In this case, in the forming of the liquid holding regions, the liquid holding region of the non-functional region may be formed in a strip shape along the functional region. In such a manner, when the liquid holding region of the non-functional region is formed in the strip shape along the functional region and the solvent is discharged onto the liquid holding region, the amount of the solvent (the amount of the solvent per unit area) in the non-functional region can be increased with high efficiency.

Next, according to a third aspect of the invention, there is provided an electro-optical device which is manufactured by using the above-described method of manufacturing an electro-optical device. In such an electro-optical device, the film thickness of the electro-optical element layer is formed with a uniform pixel pattern, such that an electro-optical device having high reliability can be obtained. In particular, when the electro-optical device is used in a display device, a display device having small display irregularity and excellent visibility can be obtained. Further, according to a fourth aspect of the invention, there is provided an electronic apparatus which includes the above-described electro-optical device as a display unit. In this case, the electronic apparatus includes a display unit having high reliability and excellent visibility.

Moreover, as an electro-optical device according to the second aspect of the invention, an organic electroluminescent device (hereinafter, electroluminescent is referred to as EL) can be exemplified. In such an organic EL device, a region for display can be set to the functional region and a region other than the region for display can be set to the non-functional region. Then, a method of manufacturing an organic EL device may include, for example, forming a partition wall to form the liquid holding regions in the functional region and the non-functional region on the substrate, and discharging the liquid material made of a composition for an organic EL element (an electro-optical element) onto the liquid holding region surrounded by the partition wall.

Moreover, as the composition for the organic EL element, for example, a material for a light emitting layer or a hole injecting/transporting layer, specifically, a material in which an organic material for the functional layer is dispersed or dissolved into a predetermined solvent, may be used. Further, the discharging of the liquid material can be performed, for example, by a liquid droplet discharge device having a liquid droplet discharge head.

BRIEF DESCRIPTION OF THE DRAWINGS

The invention will be described with reference to the accompanying drawings, wherein like numbers reference like elements, and wherein:

FIG. 2A is a plan view schematically showing the display device of FIG. 1;

FIG. 2B is a cross-sectional view schematically showing the display device of FIG. 1;

FIG. 18 is a process view illustrating the manufacturing method, which is subsequent to FIG. 9;

FIG. 19 is a process view illustrating the manufacturing method, which is subsequent to FIG. 18;

FIG. 31A is a plan view showing a still further modification in which liquid droplets are discharged;

FIG. 31B is a cross-sectional view showing a still further modification in which liquid droplets are discharged;

FIG. 31C is a graph showing a value of a vapor pressure;

DESCRIPTION OF THE EMBODIMENTS

First Embodiment

Hereinafter, an organic EL display device according to a first embodiment of the invention and a method of manufacturing an organic EL display device will be described.

Figure 1:
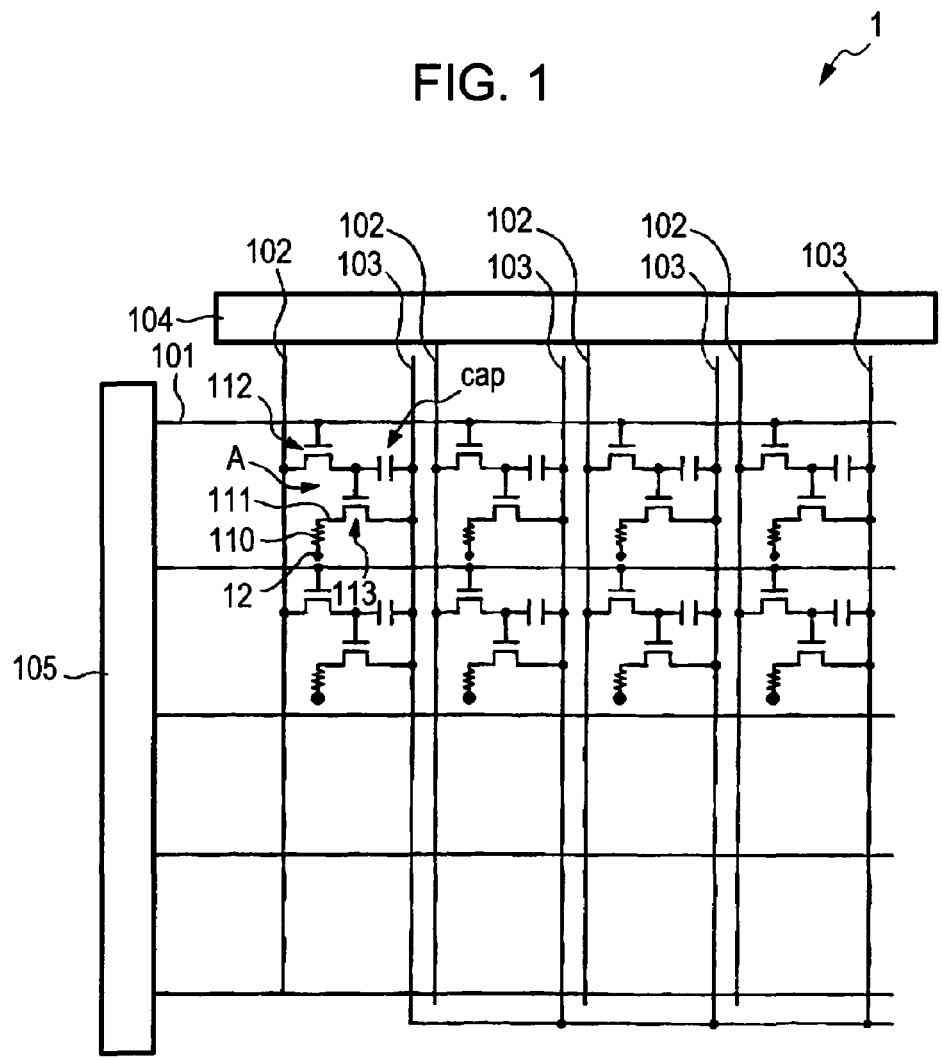
FIG. 1 is a plan view schematically showing a wiring structure of a display device according to a first embodiment of the invention.

FIG. 1 is an explanatory view showing a wiring structure of an organic EL display device of the present embodiment. FIG. 2A is a plan view schematically showing the organic EL display device of the present embodiment and FIG. 2B is a cross-sectional view schematically showing the organic EL display device.

As shown in FIG. 1, the organic EL display device 1 of the present embodiment has a plurality of scanning lines 101, a plurality of signal lines 102 which extend in a direction to cross the scanning lines 101, and a plurality of power lines 103 which extend parallel to the signal lines 103. At intersections of the scanning lines 101 and the signal lines 102, pixel regions A are provided.

The signal lines 102 are connected to a data-side driving circuit 104 provided with a shift resister, a level shifter, a video line, and an analog switch. Further, the scanning lines 101 are connected to a scanning-side driving circuit 105 provided with a shift resister and a level shifter.

Each pixel region is provided with a switching thin film transistor 112 a gate electrode of which is supplied with a scanning signal via the scanning line 101, a storage capacitor cap which stores a pixel signal supplied from the signal line 102 via the switching thin film transistor 112, a driving thin film transistor 123 a gate electrode of which is supplied with the pixel signal stored in the storage capacitor cap, a pixel electrode 111 in which a driving current flows from the power line 103 when being electrically connected to the power line 103 via the driving thin film transistor 113, and a functional layer 110 which is disposed between the pixel electrode 111 and a cathode (counter electrode (electrode)) 12. Moreover, the pixel electrode 111, the counter electrode 12, and the functional layer 110 constitute a light emitting element.

According to such a configuration, when the scanning line 101 is driven and the switching thin film transistor 112 is turned on, the potential of the signal line 102 at that time is stored in the storage capacitor cap, and, according to the state of the storage capacitor cap, the driving thin film transistor 113 is turned on or off. Then, a current flows in the pixel electrode 111 from the power line 103 via a channel of the driving thin film transistor 113 and the current further flows in the cathode 12 via the functional layer 110. The functional layer 110 emits light according to the amount of current flowing therein.

Next, as shown FIGS. 2A and 2B, the display device 1 of the present embodiment has a transparent base substrate 2 made of glass or the like, light emitting elements arranged in a matrix shape, and a sealing substrate 604. The light emitting element formed on the base substrate 2 is formed with the pixel electrode 111, the functional layer 110, and the cathode 12.

The base substrate 2 is a transparent substrate, such as glass or the like. The base substrate 2 is divided into a display region 2a disposed at a center of the base substrate 2 and a non-display region 2b disposed on a circumference of the base substrate 2 and arranged outside the display region 2a.

The display region 2a is a region which is formed by the light emitting elements arranged in the matrix shape and is referred to as an effective display region or a functional region. Further, the non-display region 2b is formed adjacent to the display region 2a. The non-display region 2b is constructed by a dummy region (non-functional region) which is not for display.

Further, as shown in FIG. 2B, in a thicknesswise direction of the base substrate 2, a circuit element portion 14 is provided between the base substrate 2 and a light emitting element portion 11 having the light emitting element and a partition wall. The circuit element portion 14 includes the above-described scanning line, the signal line, the storage capacitor, the switching thin film transistor, and the driving thin film transistor 113.

Further, one end of the cathode 12 is connected to a cathode wiring (not shown) formed on the base substrate 2. One end 12a of the wiring is connected to a wiring 5a on a flexible substrate 5. Further, the wiring 5a is connected to a driving IC 6 (driving circuit) provided on the flexible substrate 5.

Further, as shown in FIGS. 2A and 2B, on the non-display region 2b of the circuit element portion 14, the above-described power lines 103 (103R, 103G, and 103B) are wired.

Further, on both transverse sides of the display region 2a shown in FIG. 2A, the above-described scanning-side driving circuits 105 and 105 are arranged. The scanning-side driving circuits 105 and 105 are provided in the circuit element portion 14 under the dummy region 2b. In addition, in the circuit element portion 14, driving circuit control signal wiring lines 105a and driving circuit power wiring lines 105b connected to the scanning-side driving circuits 105 and 105 are provided.

In addition, a test circuit 106 is arranged on an upper side of the display region 2a shown in FIG. 2A. With the test circuit 106, quality and the presence of defects of the display device during manufacture and shipping can be tested.

Further, as shown in FIG. 2B, a sealing portion 3 is provided on the light emitting element portion 11. The sealing portion 3 has a sealing resin 603 coated on the base substrate 2 and the sealing substrate 604. The sealing resin 603 is made of thermosetting resin, ultraviolet curable resin, or the like. In particular, it is preferable that the sealing resin 603 be made of epoxy resin, which is one type of thermosetting resin.

The sealing resin 603 is coated in a ring shape around the base substrate 2 with a microdispenser or the like. The sealing resin 603 is intended to bond the base substrate 2 to the sealing substrate 604. Therefore, penetration of water or oxygen into the sealing substrate 604 between the substrate 2 and the sealing substrate 604 is prevented. Consequently, oxidation of the cathode 12 or the light emitting layer provided in the light emitting element portion 11 is prevented.

The sealing substrate 604 made of glass or a metal is bonded to the base substrate 2 with the sealing resin 603. The sealing substrate 604 is provided with a concave portion 604a to receive a display element 10 therein. Further, a getter agent 605 which absorbs water or oxygen is adhered to the concave portion 604a, thereby absorbing water or oxygen penetrated into the sealing substrate 604. Moreover, the getter agent 605 may be omitted.

Figure 3:
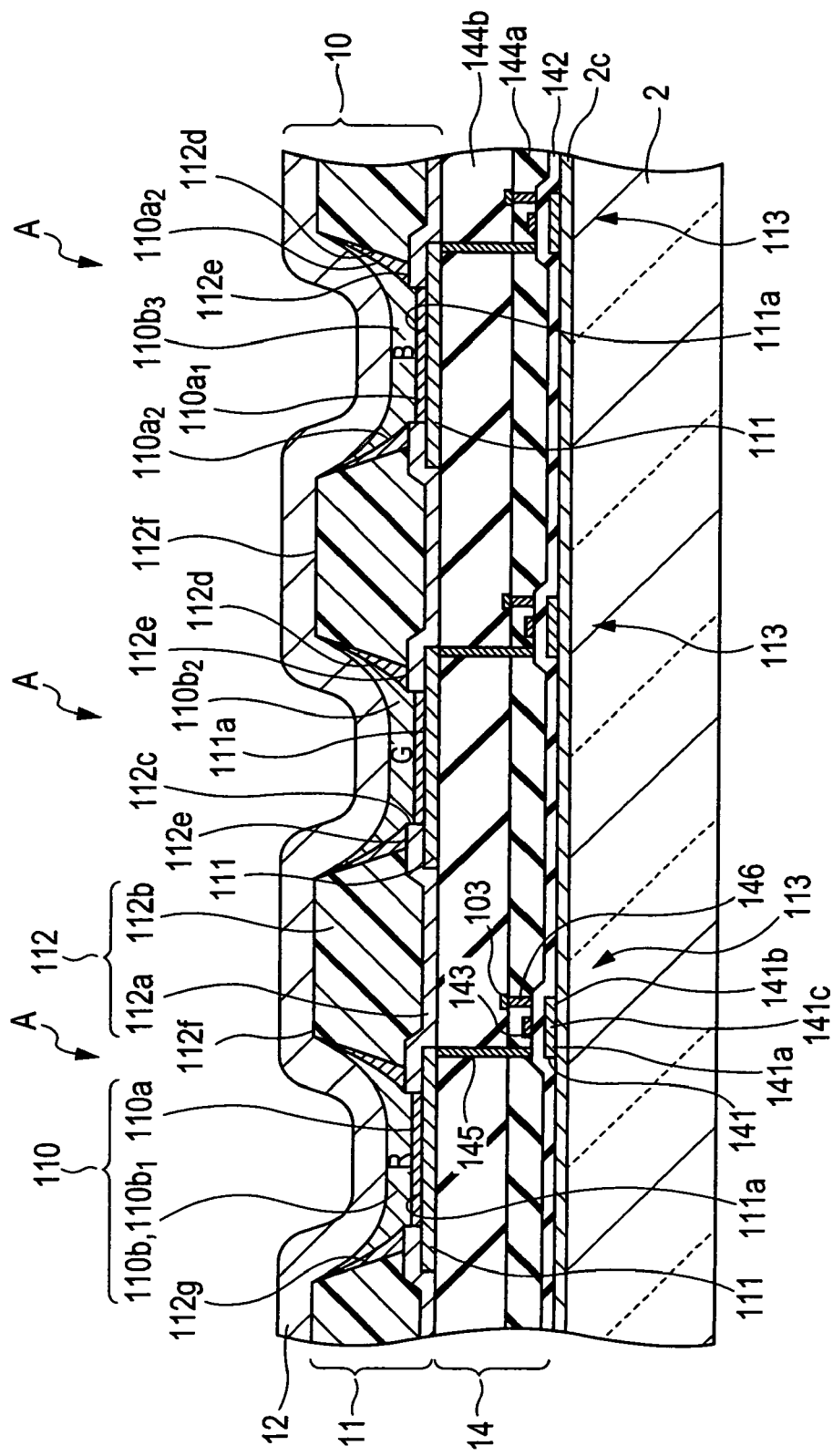
FIG. 3 is a cross-sectional view schematically essential parts of the display device of FIG. 1.

Next, FIG. 3 shows an expanded cross-sectional structure of the display region in the display device. The display device 1 has a configuration in which the circuit element portion 14 provided with circuits of TFTs and the like, and the light emitting element portion 11 provided with the functional layer 110 are sequentially laminated on the base substrate 2.

In the display device 1, light emitted from the functional layer 110 toward the base substrate 2 passes through the circuit element portion 14 and the base substrate 2 and is emitted below the base substrate 2 (observer side). Further, light emitted from the functional layer 110 toward an opposite side to the base substrate 2 is reflected by the cathode 12, passes through the circuit element portion 14 and the base substrate 2, and is emitted below the base substrate 2 (observer side).

Moreover, by forming the cathode 12 with a transparent material, light emitted from the cathode is allowed to be emitted. As the transparent material, ITO, platinum (Pt), iridium (Ir), nickel (Ni), or palladium (Pd) can be used. As regards the film thickness, it is preferable to have a film thickness of about 75 nm. More specifically, it is more preferable to have a smaller film thickness.

In the circuit element portion 14, a base protective film 2c made of a silicon oxide film is provided on the base substrate 2, and an island-shaped semiconductor film 141 made of polycrystalline silicon is provided on the base protective film 2c. Moreover, the semiconductor film 141 is provided with a source region 141a and a drain region 141b by high-concentration phosphorus (P) ion implantation. A portion in which no P is introduced serves as a channel region 141c. In addition, a transparent gate insulating film 142 covering the base protective film 2c and the semiconductor film 141 is provided in the circuit element portion 14. A gate electrode 143 (scanning line 101) made of aluminum (Al), molybdenum (Mo), tantalum (Ta), titanium (Ti), tungsten (W), or the like is provided on the gate insulating film 142. A transparent first interlayer insulating film 144a and a second interlayer insulating film 144b are provided on the gate electrode 143 and the gate insulating film 142. The gate electrode 143 is provided at a location corresponding to the channel region 141c of the semiconductor film 141.

Contact holes 145 and 146 which penetrate the first and second interlayer insulating films 144a and 144b and which are connected to the source region 141a and the drain region 141b, respectively, are provided. Then, on the second interlayer insulating film 144b, the transparent pixel electrode 111 made of ITO or the like is patterned in a predetermined shape. The contact hole 145 is connected to the pixel electrode 111. Further, the contact hole 146 is connected to the power line 103. In such a manner, in the circuit element portion 14, the driving thin film transistor 113 connected to each pixel electrode 111 is formed. Moreover, though not shown in FIG. 3, in the circuit element portion 14, the storage capacitor cap and the switching thin film transistor 112 are formed.

Next, as shown in FIG. 3, the light emitting element portion 11 primarily has the functional layer 110 laminated on each of the plurality of pixel electrodes 111, and a partition wall 122 provided between the pixel electrode 111 and the functional layer 110 to partition the functional layer 110, and the cathode 12 formed on the functional layer 110. The pixel electrode (first electrode) 111, the functional layer 110, and the cathode 12 (counter electrode (electrode)) constitute the light emitting element. Here, the pixel electrode 111 is made of, for example, ITO and is patterned in a substantially square shape in plan view. Preferably, the thickness of the pixel electrode 111 is in a range of from 50 to 200 nm. More preferably, the thickness of the pixel electrode 111 is about 150 nm.

As shown in FIG. 3, the partition wall 122 has a configuration in which an inorganic partition wall layer (first partition wall layer) 112a disposed at the base substrate 2 side and an organic partition wall layer (second partition wall layer) 112b spaced away from the base substrate 2 are laminated.

The inorganic partition wall layer 112a and the organic partition wall layer 112b are provided in such a manner that they are mounted on the circumference of the pixel electrode 111. The circumference of the pixel electrode 111 overlaps the inorganic partition wall layer 112a in plan view. Further, the organic partition wall layer 112b is disposed to overlap a portion of the pixel electrode 111 in plan view. In addition, the inorganic partition wall layer 112a is formed at the center of the pixel electrode 111, as compared to the organic partition wall layer 112b. In such a manner, when a first lamination portion 112e of the inorganic partition wall layer 112a is formed in an inner side of the pixel electrode 111, a lower opening 112c corresponding to a formation position of the pixel electrode 111 is provided.

Further, an upper opening 112d is formed in the organic partition wall layer 112b. The upper opening 112d is provided to correspond to the formation position of the pixel electrode 111 and the lower opening 112c. The upper opening 112d is formed to be wider than the lower opening 112c and to be narrower than the pixel electrode 111, as shown in FIG. 3. Further, an upper portion of the upper opening 112d may have the substantially same position as an end portion of the pixel electrode 111. In this case, the upper opening 112d of the organic partition wall layer 112b has an inclined section, as shown in FIG. 3.

Then, the partition wall 122 is provided with an opening 112g passing through the inorganic partition wall layer 112a and the organic partition wall layer 112b when the lower opening 112c is connected to the upper opening 112d.

Further, the inorganic wall 112a is preferably made of an inorganic material such as $SiO_2$, $TiO_2$, or the like. A film thickness of the inorganic partition wall layer 112a is preferably in a range of from 50 to 200 nm, more preferably, about 150 nm. If the film thickness is less than 50 nm, the flatness of a hole injecting/transporting layer, which will be described later, may be not secured since the inorganic partition wall layer 112a may be thinner than the hole injecting/transporting layer. Further, if the film thickness exceeds 200 nm, the flatness of a light emitting layer, which will be described later, to be laminated on the hole injecting/transporting layer may be not secured due to a large step of the lower opening 112c.

Moreover, the organic partition wall layer 112b is made of a material having heat resistance and solvent resistance, such as acrylic resin, polyimide resin, or the like. The thickness of the organic partition wall layer 112b is preferably in a range of from 0.1 to 3.5 μm, and more preferably, 2 μm. If the thickness is less than 0.1 μm, the light emitting layer may overflow the upper opening 112d since the organic partition wall layer 112b becomes thinner than the total thickness of the hole injecting/transporting layer and the light emitting layer, which will be described later. Further, if the thickness exceeds 3.5 μm, a step coverage of the cathode 12 formed on the organic partition wall layer 112b may not be secured since the step of the upper opening 112d becomes large. Further, if the thickness of the organic partition wall layer 112b exceeds 2 μm, electrical isolation from the driving thin film transistor 113 can be enhanced.

Further, the partition wall 122 is provided with a lyophilic region and a liquid repellency region. The lyophilic region includes a first lamination portion 112e of the inorganic partition wall layer 112a and an electrode surface 111a of the pixel electrode 111, which are subjected to a lyophilic surface treatment by a plasma treatment using oxygen as a treatment gas. Further, the liquid repellency region includes a wall surface of the upper opening 112d and an upper surface 112f of the organic partition wall layer 112b, which are subjected to a fluorination (liquid repellency) surface treatment by a plasma treatment using tetrafluoromethane, methane tetrafluoride or carbon tetrafluoride as a treatment gas. Moreover, the organic partition wall layer may be formed with a material containing fluorine-based polymer.

Next, as shown in FIG. 3, the functional layer 110 includes the hole injecting/transporting layer 110a laminated on the pixel electrode 111, and the light emitting layer 110b formed adjacent to the hole injecting/transporting 110a. Further, an additional functional layer having a function of an electron injecting/transporting layer or the like may be formed adjacent to the light emitting layer 110b. The hole injecting/transporting layer 110a serves to inject holes into the light emitting layer 110b and transport the holes into the hole injecting/transporting layer 110a. By forming the hole injecting/transporting layer 110a between the pixel electrode 111 and the light emitting layer 110b, element characteristics such as light emission efficiency and life span of the light emitting layer 110b can be improved. In addition, the light emitting layer 110b can emit light when holes injected from the hole injecting/transporting 110a and electrons injected from the cathode 12 are recombined therein.

The hole injecting/transporting layer 110a includes a flat portion 110a1 disposed within the lower opening 112c and formed on the pixel electrode surface 111a, and a peripheral portion 110a2 disposed within the upper opening 112d and formed on the first lamination portion 112e of the inorganic partition wall layer. In addition, the hole injecting/transporting layer 110a may be formed on the pixel electrode 111 and between the pixel electrode 111 and the inorganic partition wall layer 110a (the lower opening 110c) according to structures (or may be formed on the above-described flat portion). The flat portion 110a1 has a uniform thickness in a range of from 50 to 70 nm, for example.

The peripheral portion 110a2 is formed to be disposed on the first lamination portion 112e and to be closely adhered to the wall surface of the upper opening 112d, that is, the organic partition wall layer 112b. Further, the thickness of the peripheral portion 110a2 is thin at a side close to the electrode surface 111a and is the thickest near the wall surface of the lower opening 112d while increasing in a direction apart away from the electrode surface 111a. The reason why the peripheral portion 110a2 has such a shape is that the hole injecting/transporting layer 110a is formed by discharging a first composition containing a hole injecting/transporting formation material and a polar solvent into the opening 112 and then removing the polar solvent. Further, since the polar solvent is mainly volatilized on the first lamination portion 112e of the inorganic partition wall layer, the hole injecting/transporting layer formation material is intensely concentrated and educed on the first lamination portion 112e.

In addition, the light emitting layer 110b is formed across the flat portion 110a1 and the peripheral portion 110a2 of the hole injecting/transporting layer 110a and has the thickness ranging from 50 to 80 nm on the flat portion 110a1. The light emitting layer 110b has three kinds of light emitting layers, that is, a red color light emitting layer 110b1 emitting red color (R) light, a green color light emitting layer 110b2 emitting red color (G) light, and a blue color light emitting layer 110b3 emitting blue color (B) light, which are disposed in respective stripe shapes.

In such a manner, since the peripheral portion 110a2 of the hole injecting/transporting layer 110a is adhered to the wall surface (the organic partition wall layer 112b) of the upper opening 112d, the light emitting layer 110b does not directly contact the organic partition wall layer 112b. Accordingly, the peripheral portion 110a2 can prevent water contained as an impurity in the organic partition layer 112b from moving into the light emitting layer 110b and prevent the light emitting layer 110b from being oxidized by water. Further, since the peripheral portion 110a2 is formed at a nonuniform thickness on the first lamination portion 112e of the inorganic partition wall layer, the peripheral portion 110a2 is electrically isolated from the pixel electrode 111 by the first lamination portion 112e. Then, holes are not injected from the peripheral portion 110a2 into the light emitting layer 110b. Accordingly, a current from the pixel electrode 111 flows into only the flat portion 112a1, and thus the holes can be uniformly transported from the flat portion 112a1 to the light emitting layer 110b. As a result, only a central portion of the light emitting layer 110b emits light and the amount of light emission in the light emitting layer 110b can be uniformly maintained. In addition, since the inorganic partition wall layer 112a extends toward the center of the pixel electrode 111 from the organic partition wall layer 112b, a shape of a junction portion between the pixel electrode 111 and the flat portion 110a1 is trimmed by the inorganic partition wall layer 112a. Thus, unevenness in light emission strength among the light emitting layers 110b can be suppressed.

In addition, since the electrode surface 111a of the pixel electrode 111 and the first lamination portion 112e of the inorganic partition wall layer have lyophilic property, the functional layer 110 is uniformly attached to the pixel electrode 111 and the inorganic partition wall layer 112a. Accordingly, the functional layer 110 is not excessively thinned on the inorganic partition wall layer 112a, and thus an electrical short between the pixel electrode 111 and the cathode 12 can be prevented. In addition, since the top surface 112f of the organic partition wall layer 112b and the wall surface of the upper opening 112d have liquid repellency property, the functional layer 110 is not attached to the organic partition wall layer 112b so well and thus the functional layer 110 does not overflow the opening 112g.

Further, as the hole injecting/transporting layer formation material, for example, polythiophene derivatives, such as polyethylenedeoxythiophene (PEDOT) or the like, and mixtures, such as polystylenesulfonic acid (PSS) or the like, can be used. Further, as a formation material of the light emitting layer 110b, polyfluorene derivatives, polyphenylene derivatives, polyvinylcarbazole, polythiophene derivatives can be used. In addition, the high molecular materials doped with phenylene-based pigments, coumarin-based pigments, rhodamine-based pigments, rubrene, perylene, 9,10-diphenylanthracene, tetraphenylbutadiene, Nile Red, coumarin 6, quinacridone, or the like can be used.

The cathode 12 is formed on the entire surface of the light emitting element portion 11 and serves to flow a current into the functional layer 110, together with the pixel electrode 111. The cathode 12 is formed, for example, by laminating a calcium layer and an aluminum layer. At this time, the cathode provided near the light emitting layer is preferably formed to have low work function. In particular, with this configuration, the cathode having low work function comes in direct contact with the light emitting layer 110b and serves to inject electrons into the light emitting layer 110b. In addition, lithium fluoride (LiF) may be formed between the light emitting layer 110b and the cathode 12 so as to increase the light emission efficiency according to the material for the light emitting layer. In addition, the red and green color light emitting layers 110b1 and 110b2 may use other materials without being limited to lithium fluoride. Accordingly, in this case, a layer formed with lithium fluoride is laminated on only the blue color (B) light emitting layer 110b3 and materials other than lithium fluoride may be laminated on the red and green color light emitting layers 110b1 and 110b2. Alternately, only calcium may be laminated on the red and green light emitting layers 110b1 and 11b2 without laminating lithium fluoride thereon.

In addition, the thickness of lithium fluoride is preferably in a range of from 2 to 5 nm, and more preferably, 2 nm. The thickness of calcium is preferably in a range of from 2 to 50 nm, and more preferably, 20 nm. Further, the aluminum layer forming the cathode 12 serves to reflect light emitted from the light emitting layer 110b to the base substrate 2. Alternately, a silver (Ag) layer or a laminated layer of aluminum (Al) and silver (Ag) may be used, instead of the aluminum layer. The thickness thereof is preferably in a range of from 100 to 1000 nm, and more preferably, 200 nm. In addition, an anti-oxidation protective layer formed of SiO, $SiO_2$, SiN, or the like may be formed on the aluminum layer. Further, a sealing can 604 is arranged on the resultant light emitting element in such a manner. As shown in FIG. 2B, the display device 1 is formed by bonding the sealing can 604 by means of the sealing resin 603.

Next, a manufacturing method of the display device according to the present embodiment will be described with reference to the accompanying drawings.

The manufacturing method of the display device according to the present embodiment includes a partition wall formation step of forming the partition wall on the substrate, a plasma treatment step of treating the surface of the partition wall, a functional layer formation step of forming the functional layer at an inner side of the partition wall, a counter electrode formation step, and a sealing step. Moreover, the manufacturing method of the invention is not limited to this configuration. If necessary, some of the steps may be omitted or other steps may be added.

(1) Partition Wall Formation Step

The partition wall formation step is a step of forming the partition wall 112 on the base substrate 2. The partition wall 112 has the inorganic partition wall layer 112a as a first partition wall layer and the organic partition wall layer 112b as a second partition wall layer. Hereinafter, a method of forming the respective layers will be described.

(1)-1 Formation of Inorganic Partition Wall Layer

Figure 4:
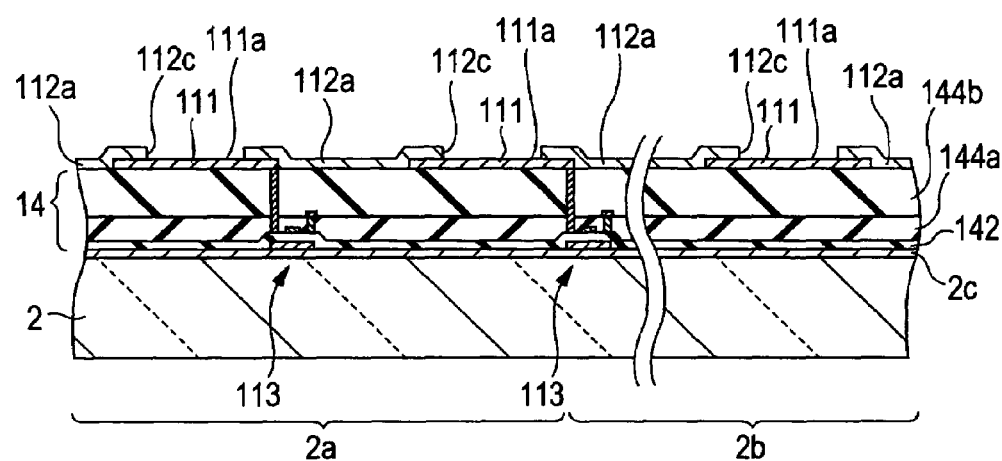
FIG. 4 is a process view illustrating a manufacturing method of the display device of FIG. 1.

As shown in FIG. 4, first, the inorganic partition wall layer 112a having a predetermined pattern is formed at a predetermined position on the base substrate 2, on which interlayer insulating layers 144a and 144b and the like are formed. The inorganic partition wall layer 112a is formed on the second interlayer insulating layer 144b and the pixel electrode (here, the pixel electrode) 111. Here, although the thin film transistor 113 is formed on the display region 2a, the thin film transistor 113 is not necessarily formed on the dummy region 2b.

The inorganic partition wall layer 112a may be made of, for example, inorganic materials such as $SiO_2$, $TiO_2$, or the like. These materials are formed by, for example, a CVD method, a coating method, a sputtering method, a deposition method, or the like.

In addition, the film thickness of the inorganic partition wall layer 112a is preferably in a range of from 50 to 200 nm, and more preferably, 150 nm.

The inorganic partition wall layer 112a is formed to have an opening by forming an inorganic film on the entire surface of the interlayer insulating layer 144 and the pixel electrode 111 and by patterning the inorganic film using a photolithography method or the like. This opening corresponds to a formation position of the electrode surface 111a of the pixel electrode 111 and is provided as the lower opening 112c, as shown in FIG. 4.

At this time, the organic partition wall layer 112a is formed so as to partially overlap the peripheral portion (a portion) of the pixel electrode 111. As shown in FIG. 4, by forming the inorganic partition wall layer 112a to overlap a portion of the pixel electrode 111, a light emitting region of the light emitting layer 110 can be controlled.

(1)-2 Formation of Organic Partition Wall Layer 112b

Next, the organic partition wall layer 112b is formed as the second partition wall layer.

Figure 5:
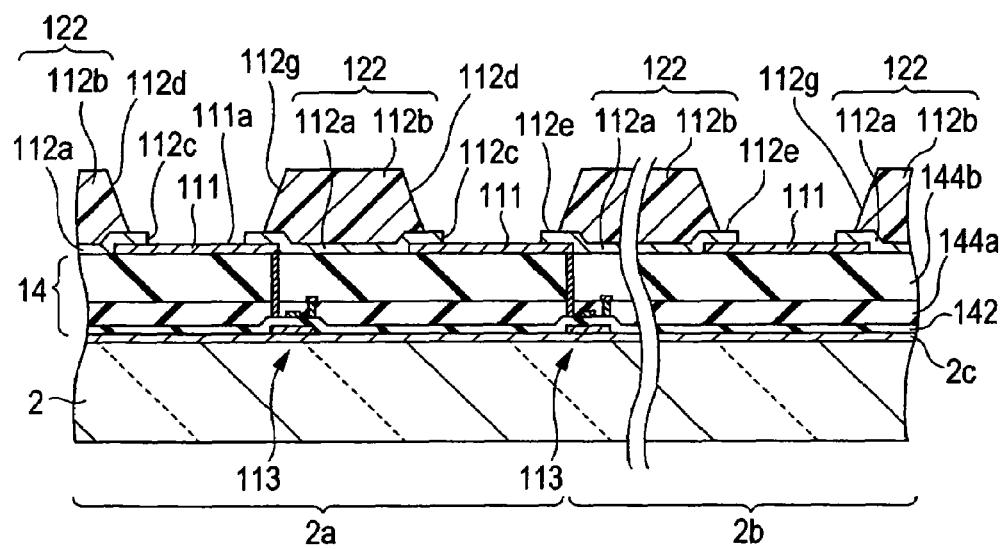
FIG. 5 is a process view illustrating the manufacturing method of the display device of FIG. 1, which is subsequent to FIG. 4.

As shown in FIG. 5, the organic partition wall layer 112b is formed on the inorganic partition wall layer 112a on which the display region 2a and the dummy region 2b are formed. The organic partition wall layer 112b is made of a heat-resistant and solvent-resistant material such as acryl resin, polyimide resin, or the like. The organic partition wall layer 112b is formed by patterning the material using a photolithography method or the like. In addition, at the time of patterning, the upper opening 112d is formed in the organic partition wall layer 112b. The upper opening 112d is provided at a position corresponding to the electrode surface 111a and the lower opening 112c.

As shown in FIG. 5, the upper opening 112d is preferably formed to be wider than the lower opening 112c formed in the inorganic partition wall layer 112a. Moreover, the organic partition wall layer 112b preferably has a tapered shape. The organic partition wall layer 112b is preferably formed such that the opening of the organic partition wall layer 112b is narrower than the width of the pixel electrode 111 and the uppermost of the organic partition wall layer 112b has the substantially same width as the pixel electrode 111. Accordingly, the first lamination portion 112e surrounding the lower opening 112c of the inorganic partition wall layer 112a projects toward the center of the pixel electrode 111, as compared to the organic partition wall layer 112b.

In such a manner, by connecting the upper opening 112d formed in the organic partition wall layer 112b to the lower opening 112c formed in the inorganic partition wall layer 112a, the opening 112g passing through the inorganic partition wall layer 112a and the organic partition wall layer 112b is formed and the partition wall 122 is formed in the display region 2a and the dummy region 2b.

In addition, the thickness of the organic partition wall layer 112b is preferably in a range of from 0.1 to 3.5 µm, and more preferably, 2 µm. The reason for such a range is as follows.

If the thickness is less than 0.1 µm, the thickness of the organic partition wall layer 112b is thinner than the total thickness of the hole injecting/transporting layer and the light emitting layer which will be described later. In this case, the light emitting layer 110b may overflow the upper opening 112d. If the thickness exceeds 3.5 µm, the step caused by the upper opening 112d becomes large. In this case, the step coverage of the cathode 12 for the upper opening 112d cannot be secured. In addition, if the thickness of the organic partition wall layer 112b is more than 2 µm, high electrical isolation of the cathode 12 from the driving thin film transistor 113 can be achieved.

(2) Plasma Treatment Step

Next, in the plasma treatment step, the surface of the pixel electrode 111 is activated and the surface of the partition wall 122 is treated. In particular, the activation step is performed for the purpose of cleaning the pixel electrode 111 (ITO) and adjusting work function. In addition, a lyophilic treatment of the surface of the pixel electrode 111 (lyophilic step) and a liquid repellency treatment of the surface of the partition wall 122 (liquid repellency step) are performed.

The plasma treatment step is broadly divided into, for example, (2)-1 a preheating step, (2)-2 an activation treatment step (lyophilic step), (2)-3 a liquid repellency treatment step (liquid repellency step), and (2)-4 a cooling step. However, the invention is not limited to the above-described steps, but, if necessary, some of the steps may be omitted or other steps may be added.

Figure 6:
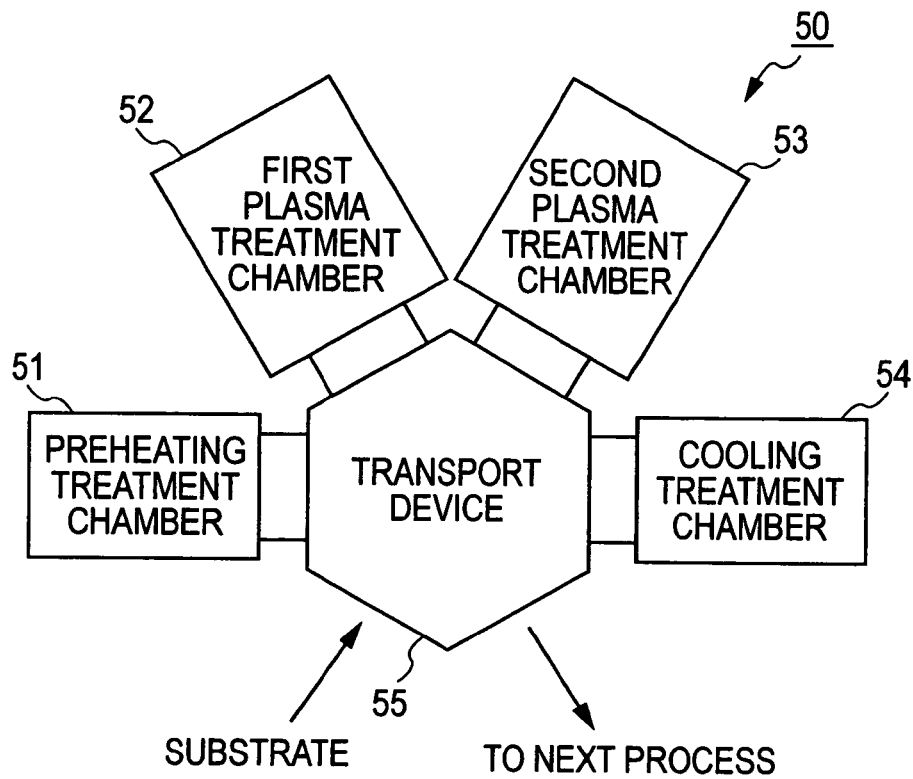
FIG. 6 is a plan view schematically showing an example of a plasma treatment apparatus.

First, FIG. 6 shows a plasma treatment apparatus used in the plasma treatment step.

The plasma treatment apparatus 50 shown in FIG. 6 includes a preheating treatment chamber 51, a first plasma treatment chamber 52, a second plasma treatment chamber 53, a cooling treatment chamber 54, and a transport device 55 to transport the base substrate 2 into each of the treatment chambers 51 to 54. The treatment chambers 51 to 54 are disposed in a radial pattern around the transport device 55.

First, the steps in which these devices are used will be roughly described. The preheating step is performed in the preheating treatment chamber 51 shown in FIG. 6. Then, the base substrate 2 transported from the partition wall formation step is heated to a predetermined temperature in the preheating treatment chamber 51. After the preheating step, the lyophilic step and the liquid repellency step are performed. That is, the base substrate 2 is sequentially transported to the first and second plasma treatment chambers 52 and 53 and the partition wall 122 is subjected to a lyophilic plasma treatment in the chambers 52 and 53, respectively. After the lyophilic plasma treatment, the liquid repellency treatment is performed. After the liquid repellency treatment, the base substrate is transported into the cooling treatment chamber where the base substrate is cooled to a room temperature. After the cooling step, the base substrate is transported by the transport device to be subjected to the subsequent hole injecting/transporting formation step.

Hereinafter, each of the above-described steps will be described in detail.

(2)-1 Preheating Step

The preheating step is performed by the preheating treatment chamber 51. In this treatment chamber 51, the base substrate 2 including the partition wall 122 is heated to the predetermined temperature.

A method of heating the base substrate 2 adopts a method in which a heater is attached to a stage to transport the base substrate 2 and the base substrate 2 is heated by the heater for each stage in the treatment chamber 51. However, it is needless to say that other methods may be adopted.

In the preheating treatment chamber 51, the base substrate 2 is heated to, for example, from 70° C. to 80° C. This temperature is the temperature needed during the plasma treatment step in the following step. It is an object of the preheating to eliminate variations in temperature of the base substrate 2 by heating the base substrate 2 in advance in consideration with the following step.

Here, if the preheating step is not applied, since the base substrate 2 is heated from the room temperature to the above-described temperature, the treatment is performed at an ever-varying temperature during the plasma treatment step from the start of the step to the end of the step. When the plasma treatment is performed while the temperature of the base substrate is varying, unevenness may occur in characteristics of the organic EL element may occur. Accordingly, preheating is performed to keep the treatment condition constant and to attain uniform characteristics.

In the plasma treatment step, when the base substrate 2 on sample stages in the first and second plasma treatment chambers 52 and 53 is subjected to the lyophilic step or the liquid repellency step, it is preferable that the preheating temperature is made to substantially be the same as the temperature of the sample stage 56 to continuously perform the lyophilic step or the liquid repellency step. For example, even when a plurality of base substrates are continuously subjected to the plasma treatment, by preheating a substrate material in advance to the temperature of the sample stages, to which they are raised in the first and second plasma treatment chambers 52 and 53, for example, a temperature range of from 70° C. to 80° C., the plasma treatment conditions immediately after the start of the treatment and immediately before the end of the treatment can be kept substantially constant. In this manner, the surface treatment conditions of the base substrates 2 are equalized, the wettability of the partition wall 122 with respect to the composition is made uniform, and a display device having consistent quality can be prepared. Further, by preheating the base substrate 2 in advance, the time required for the following plasma treatment can be reduced.

(2)-2 Activation Treatment (Lyophilic Step)

Next, the activation treatment is performed in the first plasma treatment chamber 52. The activation treatment includes the adjustment and control of the work function of the pixel electrode 111, the cleaning of the surface of the pixel electrode, and the lyophilic step of the surface of the pixel electrode.

Figure 7:
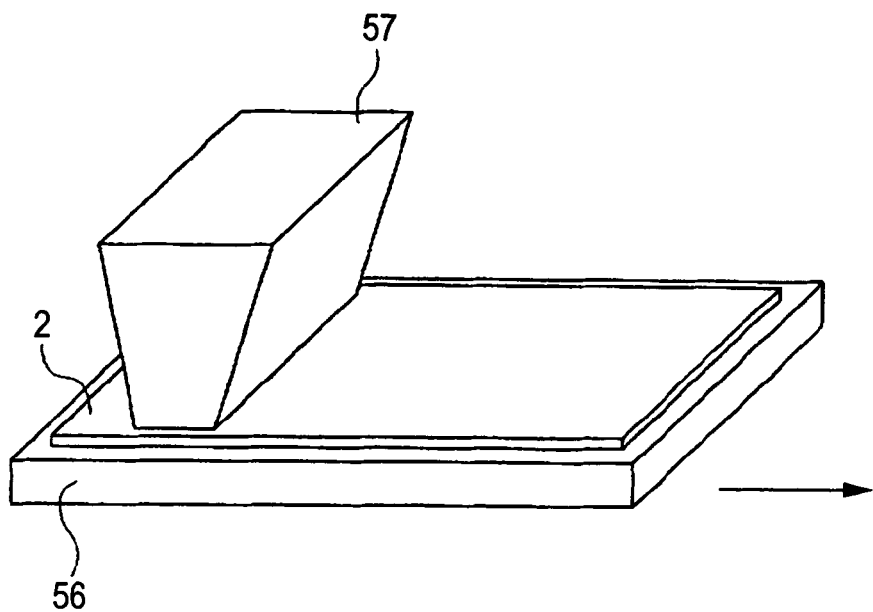
FIG. 7 is a diagram schematically showing an internal structure of a first plasma treatment chamber of the plasma treatment apparatus.

For the lyophilic step, the plasma treatment ($O_2$ plasma treatment), with oxygen serving as a treatment gas, is performed in an atmosphere of air. FIG. 7 is a diagram schematically showing the first plasma treatment. As shown in FIG. 7, the base substrate 2 including the partition wall 122 is loaded on the sample stage 56 with a built-in heater and a plasma discharge electrode 57 facing the base substrate 2 is disposed above the base substrate 2 with a gap of 0.5 mm to 2 mm. While the base substrate 2 is heated by the sample stage 56, the sample stage 56 is transported, at a predetermined transport speed, in an arrow direction shown in FIG. 7. At this time, oxygen in a plasma state is applied to the base substrate 2.

The $O_2$ plasma treatment conditions include a plasma power of 100 kW to 800 kW, an oxygen gas flow of 50 ml/min to 100 ml/min, a substrate transport speed of 0.5 mm/sec to 10 mm/sec, and a gas temperature of 70° C. to 90° C., for example. Further, the heat by the sample stage 56 is mainly performed for thermal preservation of the preheated base substrate 2.

Figure 8:
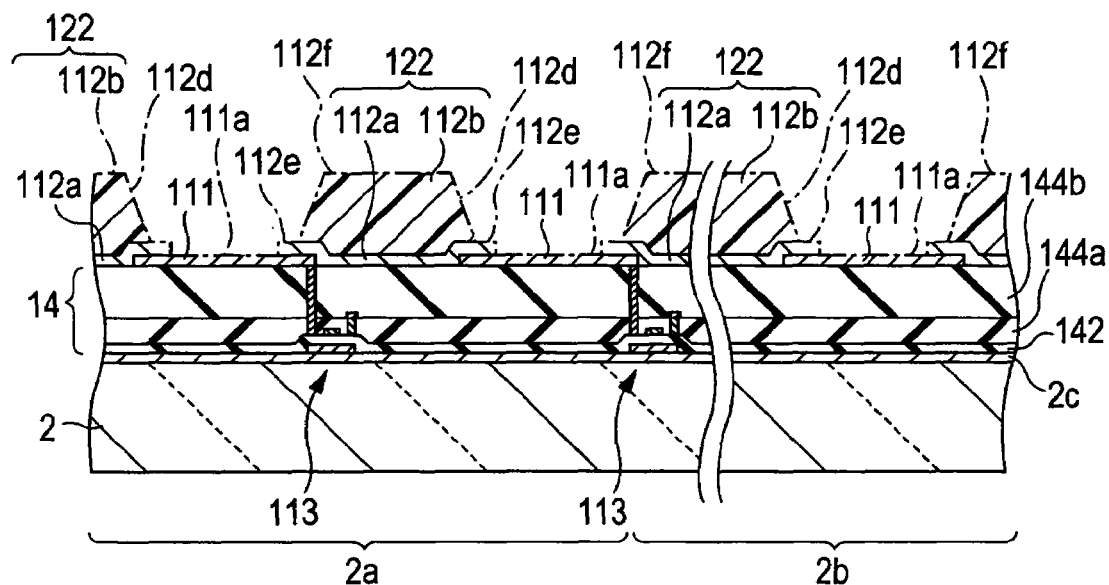
FIG. 8 is a process view illustrating the manufacturing method, which is subsequent to FIG. 5.

As shown in FIG. 8, by the $O_2$ plasma treatment, the electrode surface 111a of the pixel electrode 111, the first lamination portion 112e of the inorganic partition wall layer 112a, and the wall and surface 112f of the upper opening 112d of the organic partition wall layer 112b are subjected to a lyophilic treatment. With the lyophilic treatment, hydroxyl groups are introduced into each of these surfaces and, thereby, the lyophilic property is imparted. A portion subjected to the lyophilic treatment is shown by a one-dot-chain line in FIG. 8. Further, by the $O_2$ plasma treatment, in addition that the lyophilic property is granted, the cleaning of ITO, which is the pixel electrode, as described above, and the adjustment of the work function can be achieved.

(2)-3 Liquid Repellency Treatment Step (Liquid Repellency Step)

Next, in the second plasma treatment chamber 53, as the liquid repellency step, the plasma treatment using tetrafluoromethane as a treatment gas ($CF_4$ plasma treatment) is performed in an atmosphere of air. The second plasma treatment chamber 53 has the same internal structure as the first plasma treatment chamber 52 shown in FIG. 7. That is, when the base substrate 2 is transported at a predetermined speed for each sample stage while being heated by the sample stage, tetrafluoromethane ($CF_4$) in a plasma state is applied to the base substrate 2.

The $CF_4$ plasma treatment conditions include a plasma power of 100 kW to 800 kW, a tetrafluoromethane gas flow of 50 ml/min to 100 ml/min, a substrate transport speed of 0.5 mm/sec to 1020 mm/sec, and a substrate temperature of 70° C. to 90° C., for example. Further, the heat by the heat stage is mainly performed for thermal preservation of the preheated base substrate 2, like the first plasma treatment chamber 52. Further, as the treatment gas, different fluorocarbon gases may be used without being limited to tetrafluoromethane ($CF_4$).

Figure 9:
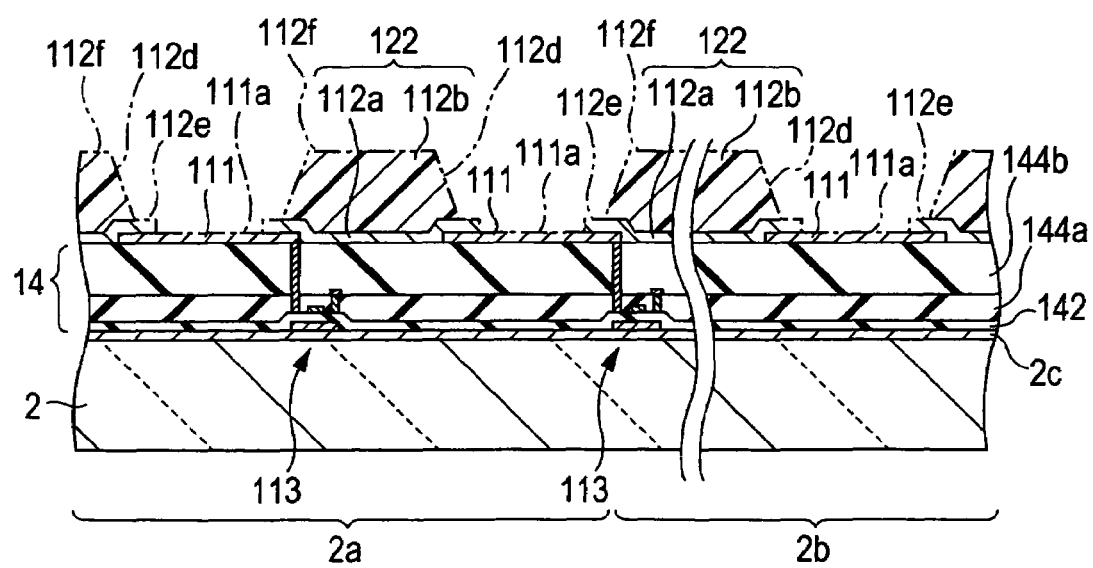
FIG. 9 is a process view illustrating the manufacturing method, which is subsequent to FIG. 8.

As shown in FIG. 9, by the $CF_4$ plasma treatment, the wall of the upper opening 112d and the upper surface 112f of the organic partition wall layer are subjected to the liquid repellency treatment. Fluorine groups are introduced into each of these surfaces by this liquid repellency treatment and thereby, the liquid repellency is imparted. Regions exhibiting the liquid repellency are shown by a two-dot-chain line in FIG. 9. Organic materials, such as an acryl resin, a polyimide resin, or the like, constituting the organic partition wall layer 112b can be easily made in the liquid repellency by applying fluorocarbon in the plasma state. Further, ones preheating by the $O_2$ plasma are apt to be fluorinated. This is particularly effective for the present embodiment. Moreover, although the electrode surface 111a of the pixel electrode 111 and the first lamination portion 112e of the inorganic partition wall layer 112a are somewhat affected by the $CF_4$ plasma treatment, this $CF_4$ plasma treatment has little effect on the wetness of the electrode surface 111a and the first lamination portion 112e. In FIG. 9, a region showing the lyophilic property is denoted by a dashed dot line.

(2)-4 Cooling Step

Next, in the cooling step, the base substrate 2 heated for the plasma treatment is cooled to a management temperature in the cooling treatment chamber 54. The cooling step is a step to cool the base substrate 2 to a control temperature of the following liquid droplet discharge step (functional layer formation step).

The cooling treatment chamber 54 has a plate to arrange the base substrate 2 and the plate has a structure in which a water cooling device to cool the base substrate 2 is built in.

Further, by cooling the plasma-treated base substrate 2 to a room temperature or a predetermined temperature (for example, a management temperature at which the liquid droplet discharge step is performed), the temperature of the base substrate material is kept constant so that the subsequent functional layer formation step can be performed at a regular temperature with no temperature variation of the base substrate 2. Accordingly, such a cooling step ensures regularity of a material discharged by a discharging method such as a liquid droplet discharge method. For example, when the first composition containing a material for forming the hole injecting/transporting layer as the functional layer is discharged, the first composition can be successively discharged by a regular volume, which results in uniform formation of the hole injecting/transporting layer.

In the above-described plasma treatment step, by performing the $O_2$ plasma treatment and the $CF_4$ plasma treatment in turn for the organic partition wall layer 112b and the inorganic partition wall layer 112a, which are different in their material, the lyophilic region and the liquid repellent region can be easily formed in the partition wall 122.

In addition, the plasma treatment apparatus used in the plasma treatment step is not limited to one shown in FIG. 6. For example, a plasma treatment apparatus 60 shown in FIG. 10 may be used.

Figure 10:
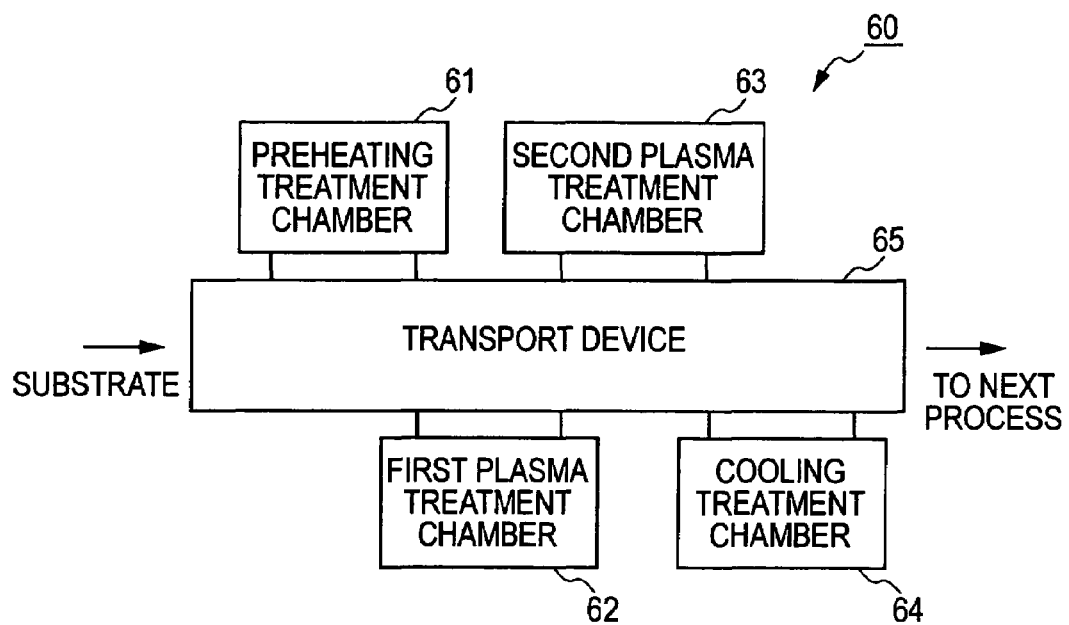
FIG. 10 is a plan view schematically showing another example of a plasma treatment apparatus.

The plasma treatment apparatus 60 shown in FIG. 10 includes a preheating treatment chamber 61, a first plasma treatment chamber 62, a second plasma treatment chamber 63, a cooling treatment chamber 64, and a transport device 65 to transport the base substrate 2 into each of the treatment chambers 61 to 64. The treatment chambers 61 to 64 are arranged at both sides in a transport direction of the transport device 65 (both sides an arrow direction in FIG. 10).

In the plasma treatment apparatus 60, like the plasma treatment apparatus shown in FIG. 6, the base substrate 2 transported from the partition wall formation step is transported into the preheating treatment chamber 61, the first and second plasma treatment chambers 62 and 63, and the cooling treatment chamber 64 in turn, the above-described treatments are performed in the treatment chambers, and then, the treated base substrate 2 is transported in the subsequent hole injecting/transporting layer formation step (functional layer formation step).

Further, the plasma treatment apparatus may be used under a vacuum, instead of the atmosphere.

(3) Hole Injecting/Transporting Layer Formation Step (Functional Layer Formation Step)

In the hole injecting/transporting layer formation step, the first composition (liquid material) containing a the hole injecting/transporting layer formation material is discharged onto the electrode surface 111a by an inkjet method (liquid droplet discharge method) using an inkjet device (liquid droplet discharge device), and then, the hole injecting/transporting layer 110a is formed on the pixel electrode 111 and the inorganic partition wall layer 112a by performing a dry treatment and a heat treatment. The inorganic partition wall layer 112a on which the hole injecting/transporting layer 110a is formed is here referred to as the first lamination portion 112e. Subsequent steps including the hole injecting/transporting layer formation step are preferably performed in an atmosphere having no water and oxygen. For example, these steps are preferably performed in an inert gas atmosphere such as a nitrogen atmosphere, an argon atmosphere, or the like. Moreover, the hole injecting/transporting layer 110a may not be formed on the first lamination portion 112e. That is, the hole injecting/transporting layer may be formed on only the pixel electrode 111. A manufacturing method according to the liquid droplet discharge method is as follows.

Figure 11:
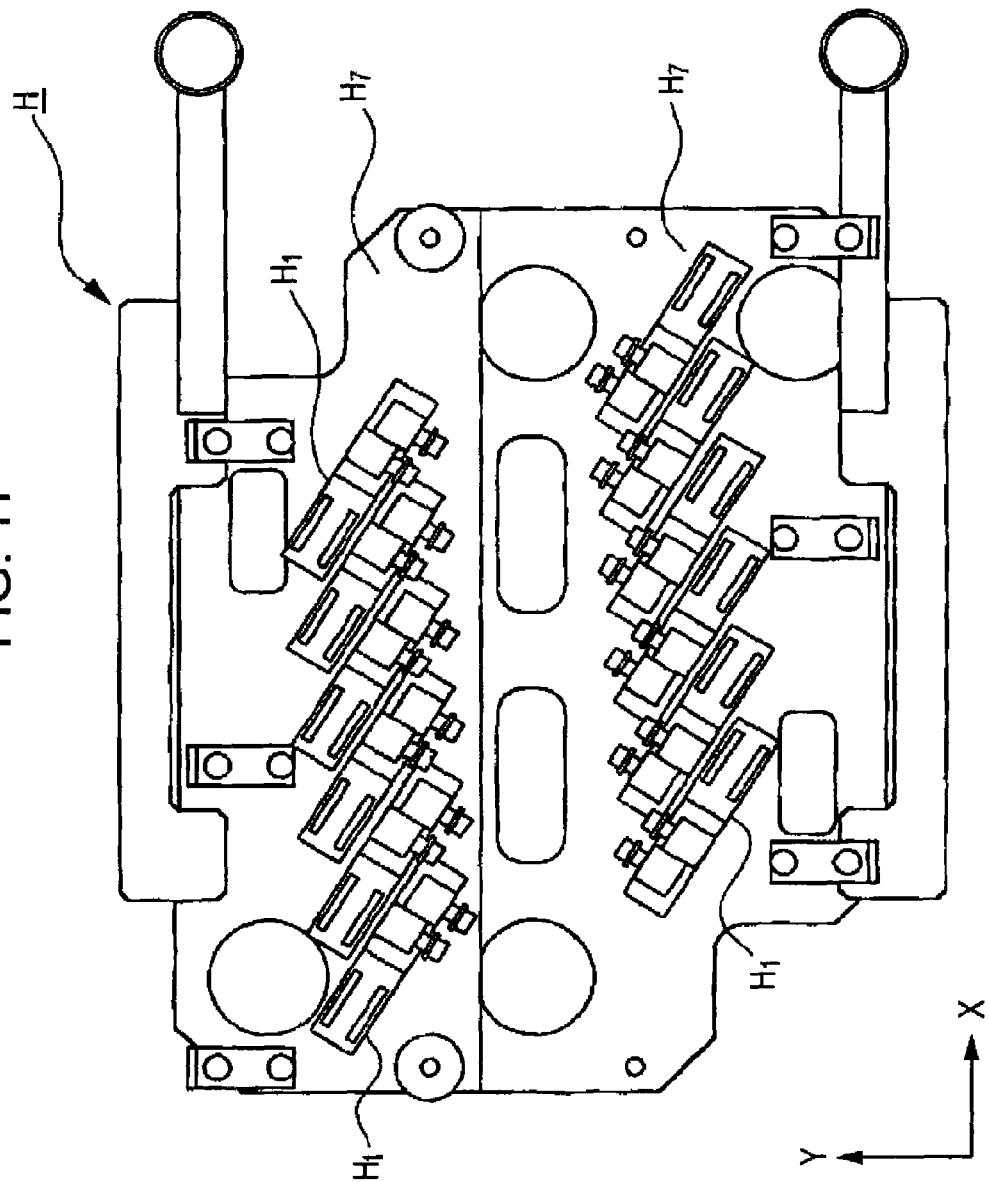
FIG. 11 is a plan view showing an example of a liquid droplet discharge head.
Figure 12:
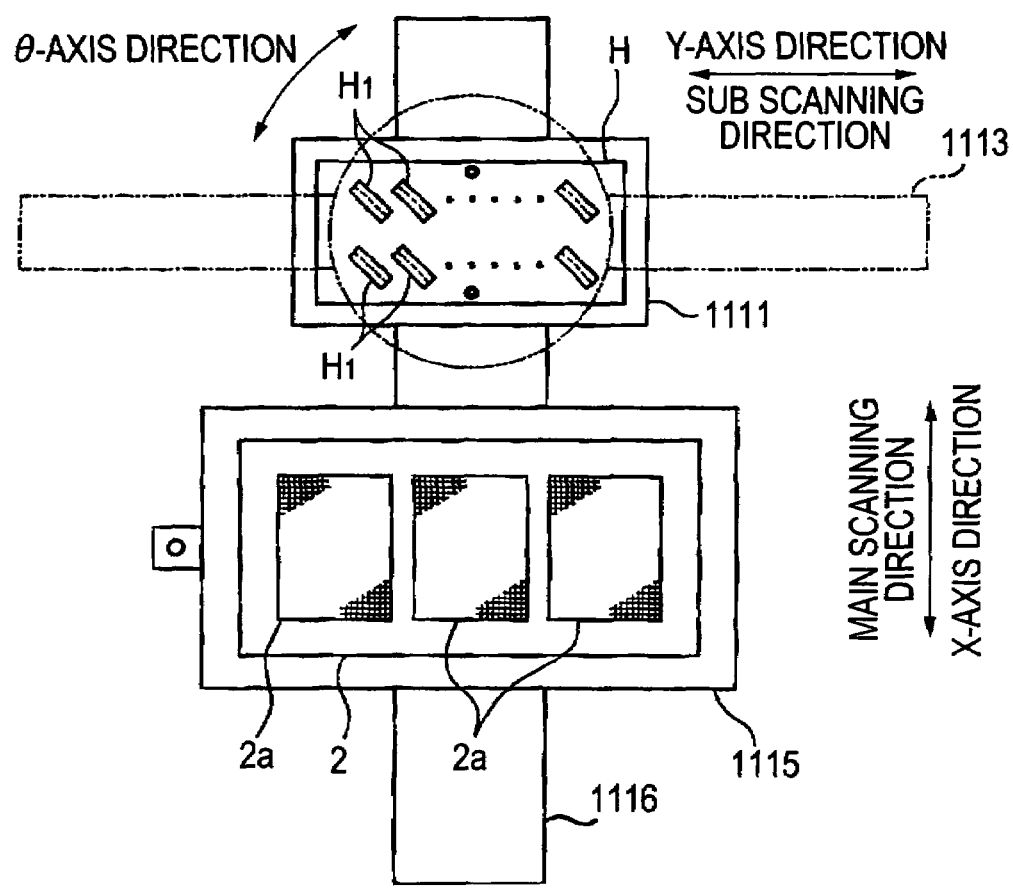
FIG. 12 is a plan view showing an example of a liquid droplet discharge device.

A head H shown in FIG. 11 can be exemplified as a liquid droplet discharge head adaptable to the manufacturing method of the display device of the present embodiment. As shown in FIG. 11, the head H includes a plurality of liquid droplet discharge heads H1 and a support substrate H7 for supporting the plurality of liquid droplet discharge heads H1. Moreover, the base substrate and the head H are preferably arranged as shown in FIG. 12. In the liquid droplet discharge device shown in FIG. 12, reference numeral 1115 denotes a stage for loading the base substrate 2 and reference numeral 1116 denotes a guide rail for guiding the stage 1115 in an X direction in FIG. 12 (main scanning direction). Further, the head H can be moved in a Y direction in FIG. 12 (subscanning direction) by a guide rail 1113 through a support member 1111. Further, the head H can be rotated in a θ-axis direction in FIG. 12 and the liquid droplet discharge head H1 may be inclined at a predetermined angle with respect to the main scanning direction.

The base substrate 2 shown in FIG. 12 has a configuration in which a plurality of tips is arranged on a mother board. That is, one tip region corresponds to one display device. Three display regions (pixel formation regions for display) 2a are exemplified in FIG. 12. This configuration is not intended to limit the invention. For example, when a composition is intended to be coated on a left display region 2a on the substrate 2, the coating is performed while scanning the base substrate 2 when the head H is moved in the left side of FIG. 12 through the guide rail 1113, and simultaneously, the base substrate 2 is moved in the top side of FIG. 12 through the guide rail 1116. Next, after the head H is moved to the right side of FIG. 12, the composition is coated on a central display region 2a on the base substrate. This is true of a right display region 2a on the base substrate. Moreover, the head H shown in FIG. 11 and the liquid droplet discharge device shown in FIG. 12 may be used in the light emitting step as well as the hole injecting/transporting layer formation.

Figure 13:
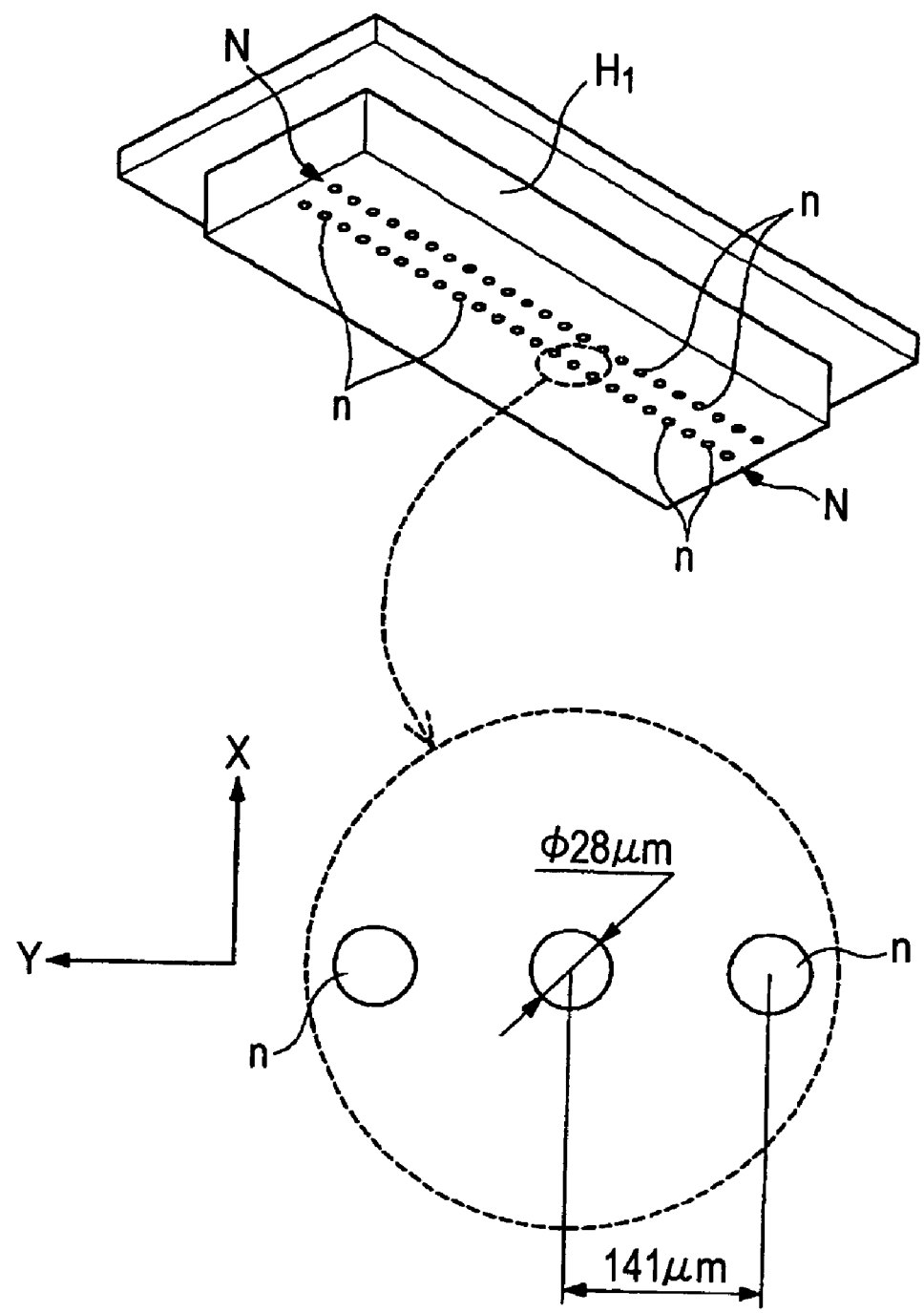
FIG. 13 is a perspective view showing an example of a liquid droplet discharge head.

FIG. 13 is a perspective view of the liquid droplet discharge head H1 when viewed from an ink discharge surface. As shown in FIG. 13, in the ink discharge surface (a surface opposite to the base substrate 2) of the liquid droplet discharge head H1, a plurality of nozzles n is provided in two columns along a longitudinal direction of the head with a gap in a width direction of the head. In such a manner, two nozzle columns N and N are provided by arranging the plurality of nozzles n in the two columns. The number of nozzles included in one nozzle column N is, for example, 180, and 360 nozzles n are provided in one liquid droplet discharge head H1. Further, a hole diameter of a nozzle n is, for example, 28 μm, and a pitch between one nozzle and another is, for example, 141 μm.

Figure 14A:
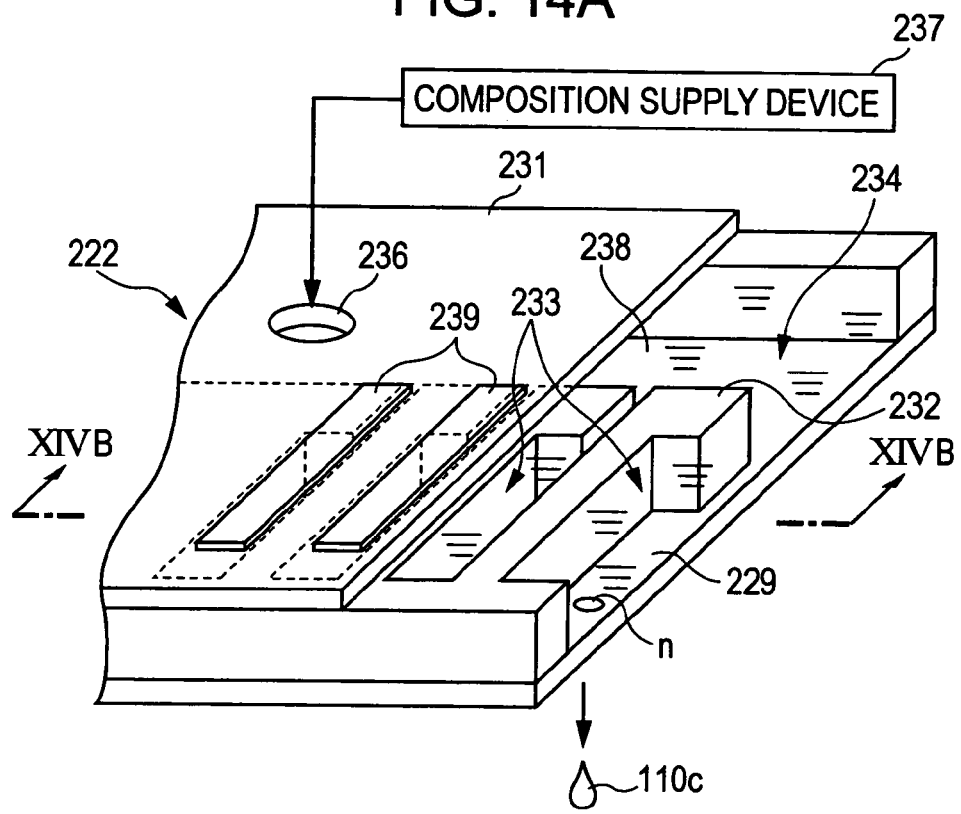
FIG. 14A is a perspective view showing an internal structure of the liquid droplet discharge head shown in FIG. 13.
Figure 14B:
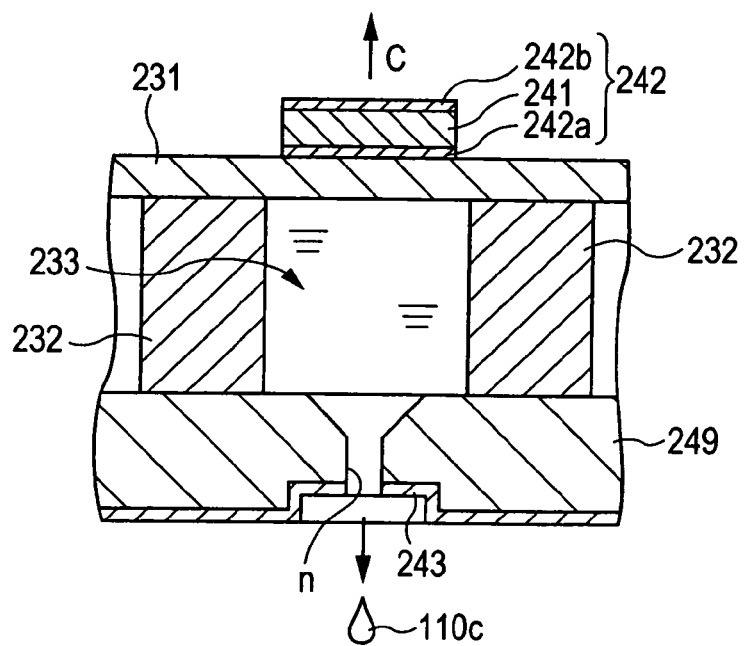
FIG. 14B is a cross-sectional view showing an internal structure of the liquid droplet discharge head shown in FIG. 13.

The liquid droplet discharge head H1 has, for example, an internal structure shown in FIGS. 14A and 14B. Specifically, the liquid droplet discharge head H1 has a stainless nozzle plate 229, a diaphragm 231 facing the nozzle plate 229, and a partition member 232 for bonding the nozzle plate 229 to the diaphragm 231. Between the nozzle plate 229 and the diaphragm 231, a plurality of composition chambers 233 and a liquid gathering chamber 234 are defined by the partition member 232. The plurality of composition chambers 233 communicate with the liquid gathering chamber 234 through a passage 238.

A composition supply hole 236 is provided at a suitable position of the diaphragm 231 and a composition supply device 237 is connected to the composition supply hole 236. The composition supply device 237 supplies the first composition (liquid material) containing the hole injecting/transporting layer formation material to the composition supply hole 236. The supplied first composition fills the liquid gathering chamber 234, and then, through the passage 238, fills the composition chamber 233.

A nozzle n for jetting the first composition from the composition chamber 233 is provided in the nozzle plate 229. On the back of a surface forming the composition chamber 233 of the diaphragm 231, a composition pressurizing member 239 is provided corresponding to the composition chamber 233. The composition pressurizing member 239 has a piezoelectric element 241 and a pair of electrodes 242a and 242b between which the piezoelectric element 241 is interposed, as shown in FIG. 14B. The piezoelectric element 241 is bent by a current flow between the pair of electrode 242a and 242b so as to project externally, as indicated by an arrow C. This increases a volume of the composition chamber 233. Then, the first composition corresponding to the increased volume is introduced from the liquid gathering chamber 234 into the composition chamber 233 through the passage 238.

Next, when the current flowing through the piezoelectric element 241 is disconnected, the piezoelectric element 241 and the diaphragm 231 return to their original shape. Accordingly, since the composition chamber 233 also returns to its original volume, pressure of the first composition contained in the composition chamber 233 is increased, and accordingly, the first composition is jetted as liquid droplets 110c from the nozzle n to the base substrate 2.

Figure 15:
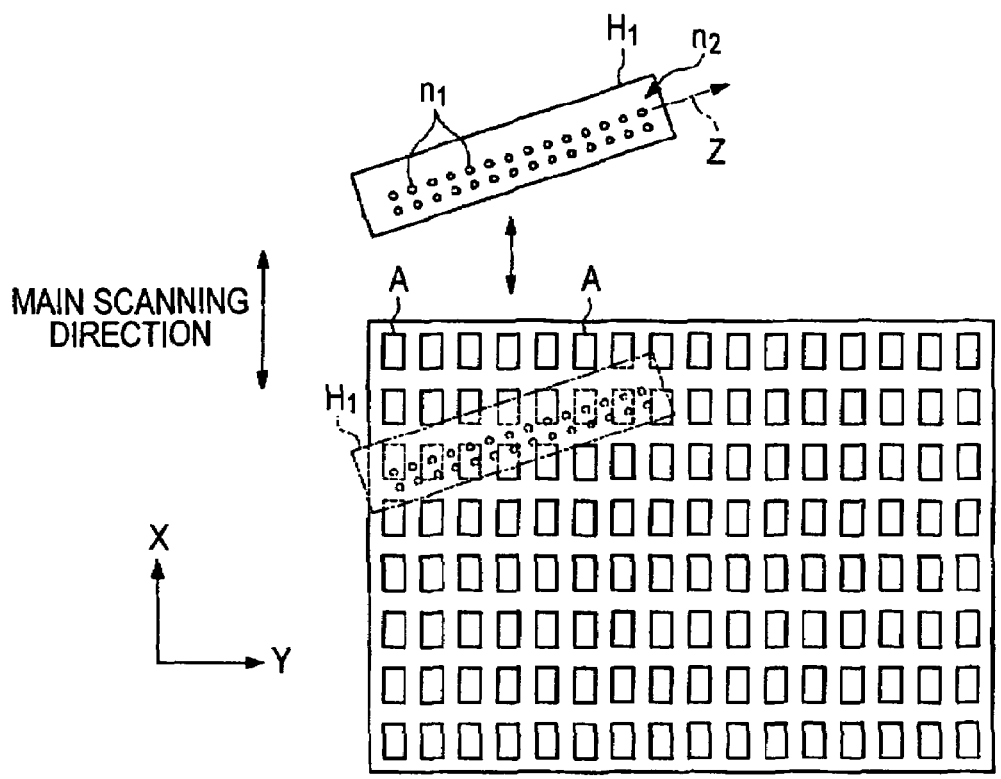
FIG. 15 is a plan view showing an arrangement state of a liquid droplet discharge head with respect to a base substrate.

FIG. 15 shows a scanning state of the liquid droplet discharge head H1 with respect to the base substrate 2. As shown in FIG. 15, the liquid droplet discharge head H1 discharges the first composition (liquid material) while relatively moving in the X direction shown in FIG. 15. At this time, an arrangement direction Z of the nozzle column N is inclined with respect to the main scanning direction (X direction).

Figure 16:
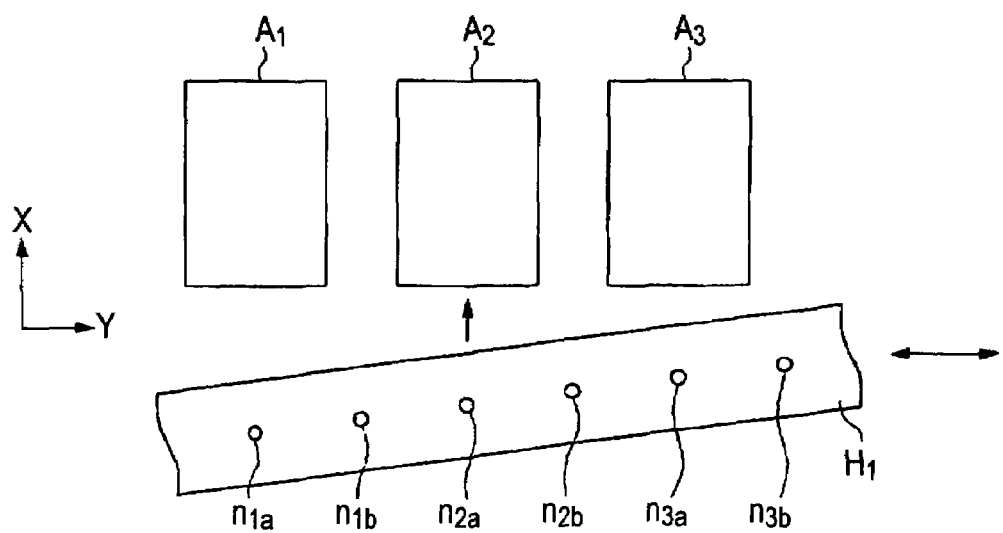
FIG. 16 is an expanded view showing essential parts of FIG. 15.

FIG. 16 is an expanded view showing essential parts of FIG. 15 when viewed from the liquid droplet discharge head H1. FIG. 16 shows three pixel regions A1 to A3 arranged in the Y direction (subscanning direction) shown in FIG. 16. Also, 6 nozzles, which are denoted by reference numerals na1 to n3b, respectively, are provided in a part of the liquid droplet discharge head H1. Of the 6 nozzles, three nozzles n1a, n2a and n3a are arranged on the pixel regions A1 to A3, respectively, when the liquid droplet discharge head H1 moves in the X direction, and three remaining nozzles n1b, n2b and n3b are arranged between adjacent pixel regions A1 to A3 when the liquid droplet discharge head H1 moves in the X direction of FIG. 16. Moreover, the 6 nozzles na1 to n3b is included in the nozzle column N. The liquid droplet discharge head H1 can be shifted in directions opposite to the X and Y directions by a driving unit (not shown). In such a manner, by inclining the nozzle column N of the liquid droplet discharge head H1 with respect to the main scanning direction, a nozzle pitch can correspond to a pitch of the pixel region A. Further, by adjusting a gradient angle, the nozzle pitch can correspond to any pitch of the pixel region A.

Next, a step of forming the hole injecting/transporting layer 110a on a predetermined region through scanning of the liquid droplet discharge head H1 will be described. This step may adopt one of (1) a method of performing one scan of the liquid droplet discharge head H1, (2) a method of performing a plurality of scans of the liquid droplet discharge head H1 and using a plurality of nozzles in the scans, and (3) a method of performing a plurality of scans of the liquid droplet discharge head H1 and using a separate nozzle for each scan. The present embodiment adopts the method (1).

Figure 17A:
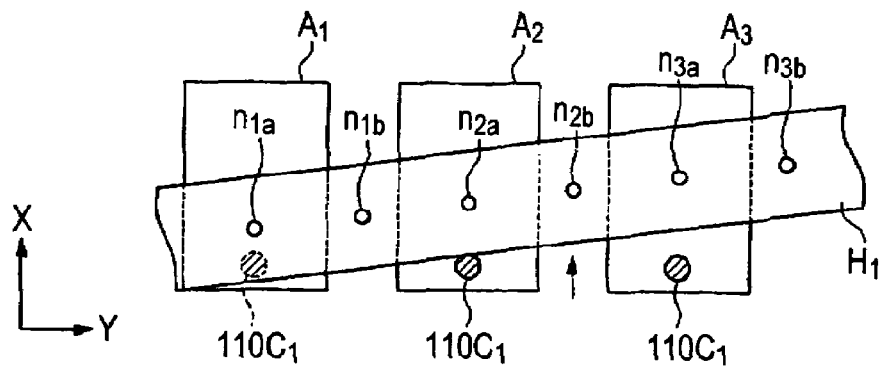
FIG. 17A is a process view showing a process when a hole injecting/transporting layer is formed by scanning a liquid droplet discharge head one time.
Figure 17B:
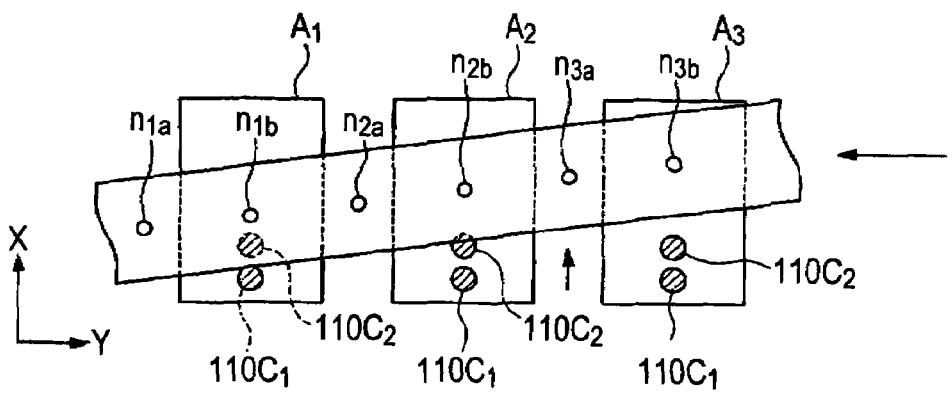
FIG. 17B is a process view showing a process when a hole injecting/transporting layer is formed by scanning a liquid droplet discharge head one time.
Figure 17C:
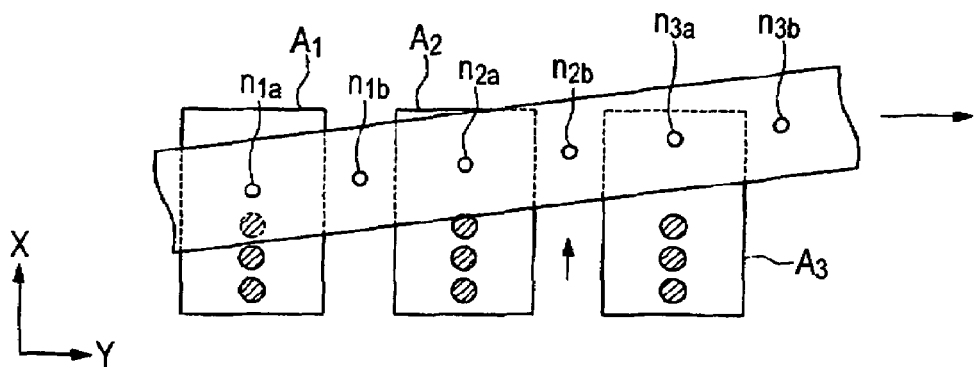
FIG. 17C is a process view showing a process when a hole injecting/transporting layer is formed by scanning a liquid droplet discharge head one time.

FIGS. 17A to 17C are process views showing a process when the hole injecting/transporting layer 110a is formed on the pixel regions A1 to A3 by one scan of the liquid droplet discharge head H1. FIG. 17A shows a state after the liquid droplet discharge head H1 is scanned in the X direction from the position in FIG. 16, FIG. 17B shows a state in which the liquid droplet discharge head H1 is scanned somewhat in the X direction from the state shown in FIG. 17A and is shifted in a direction opposite to the Y direction, and FIG. 17C shows a state in which the liquid droplet discharge head H1 is scanned somewhat in the X direction from the state shown in FIG. 17B and is shifted in the Y direction. Further, FIG. 18 shows a sectional configuration of a discharged region surrounded by the partition wall 122.

In FIG. 17A, of the nozzles formed in the liquid droplet discharge head H1, the first composition (liquid material) containing the hole injecting/transporting layer formation material is discharged onto the pixel regions A1 to A3 from the three nozzles n1a to n3a. Moreover, although the first composition is discharged through the scan of the liquid droplet discharge head H1 in the present embodiment, this can be achieved by scanning the base substrate 2. Further, even when the liquid droplet discharge head H1 and the base substrate 2 are relatively moved, the first composition can be discharged. Moreover, the above-described step is performed in the same manner as those in the following steps to be performed using the liquid droplet discharge head.

The discharge by the liquid droplet discharge head H1 is as follows. As shown in FIGS. 17A to 17C and 18, the nozzles n1a to n3a formed on the liquid droplet discharge head H1 are arranged opposite to the electrode surface 111a and first liquid droplets 111c1 of the first composition are discharged from the nozzle n1a to n3a. The pixel regions A1 to A3 are defined by the pixel electrode 111 and the partition wall 122 partitioning the circumference of the pixel electrode 111 and the first liquid droplets 111c1 of the first composition having a controlled liquid amount per one droplet are discharged for the pixel regions A1 to A3 from the nozzles n1a to n3a.

Next, as shown in FIG. 17B, by scanning the liquid droplet discharge head H1 somewhat in the X direction and shifting it in the direction opposite to the Y direction, the nozzles n1b to n3b are disposed on the pixel regions A1 to A3, respectively. Then, second liquid droplets 111c2 of the first composition are discharged for the pixel regions A1 to A3 from the nozzles n1b to n3b.

In addition, as shown in FIG. 17C, by scanning the liquid droplet discharge head H1 somewhat in the X direction and shifting it in the Y direction, the nozzles n1a to n3a are again disposed on the pixel regions A1 to A3, respectively. Then, third liquid droplets 111c3 of the first composition are discharged for the pixel regions A1 to A3 from the nozzles n1a to n3a.

In such a manner, by somewhat shifting the liquid droplet discharge head H1 in the Y direction while scanning the liquid droplet discharge head H1 in the X direction, the liquid droplets of the first composition are sequentially discharged for one pixel region A1 and the like from two nozzles. The number of liquid droplets discharged for one pixel region A1 may be in a range of from 6 to 20, for example. However, this range may be varied depending on an area of pixel. That is, the number of liquid droplets may be above or below this range. The total amount of the first composition discharged onto each pixel region (electrode surface 111a) depends on size of the lower and upper openings 112c and 112d, thickness of the hole injecting/transporting layer to be formed, concentration of the hole injecting/transporting layer formation material of the first composition, or the like.

In such a manner, if the hole injecting/transporting layer is formed by one scan, the nozzle is switched over for each discharge of the first composition and the first composition is discharged for each pixel region A1 to A3 from two nozzles. Accordingly, since irregularity of the amount of discharge between nozzles is alleviated as compared to when the composition is discharged for one pixel region A1 and the like from one nozzle, the irregularity of the amount of discharge of the first composition in each pixel electrode 111 becomes small, which results in formation of the hole injecting/transporting layer having a regular thickness. Accordingly, the amount of light emission for each pixel can be kept constant, which results in manufacturing the display device having excellent quality.

Next, an actual discharge sequence will be described. In the present embodiment, first, the liquid droplets 110c of the first composition are discharged onto only the dummy region 2b, as shown in FIG. 18, and then, the liquid droplet 110c of the first composition are discharged for the display region 2a, as shown in FIG. 19.

In the present embodiment, discharge conditions are particularly set such that a value resulting from a division of the total volume of the first composition discharged onto the dummy region 2b by an area of the dummy region 2b becomes larger than a value resulting from a division of the total volume of the first composition discharged onto the display region 2a by an area of the display region 2a. Here, the area of the dummy region 2b and the area of the display region 2a are referred to as the total area of a region surrounded by the partition wall 122 belonging to each region. By adopting such discharge conditions, when a dry treatment is performed after the discharge is performed, a partial pressure of evaporating solvent molecules in the display region 2a does not become excessively large as compared to a partial pressure of evaporating solvent molecules in the dummy region 2b, and an evaporation speed of the solvent in the dummy region 2b can approximate to an evaporation speed of the solvent in the display region 2a.

As the first composition used here, for example, a composition made by dissolving a mixture of polythiophene deriva-tives, such as polyethylenedeoxythiophene (PEDOT), and polystylenesulfonic acid (PSS), or the like in a polar solvent may be used.

The polar solvent includes, for example, isopropyl alcohol (IPA), normal butanol, γ-butylolactone, N-methyl pyrrolidone (NMP), 1,3-dimethyl-2-imidazolelidinone (DMI), derivatives thereof, glycol ether such as carbitol acetate or butyl carbitol acetate.

Further, the hole injecting/transporting layer material may adopt the same material for the red (R), green (G) and blue (B) light emitting layers 110b1 to 110b3, or may adopt different materials for different light emitting layers.

Figure 20:
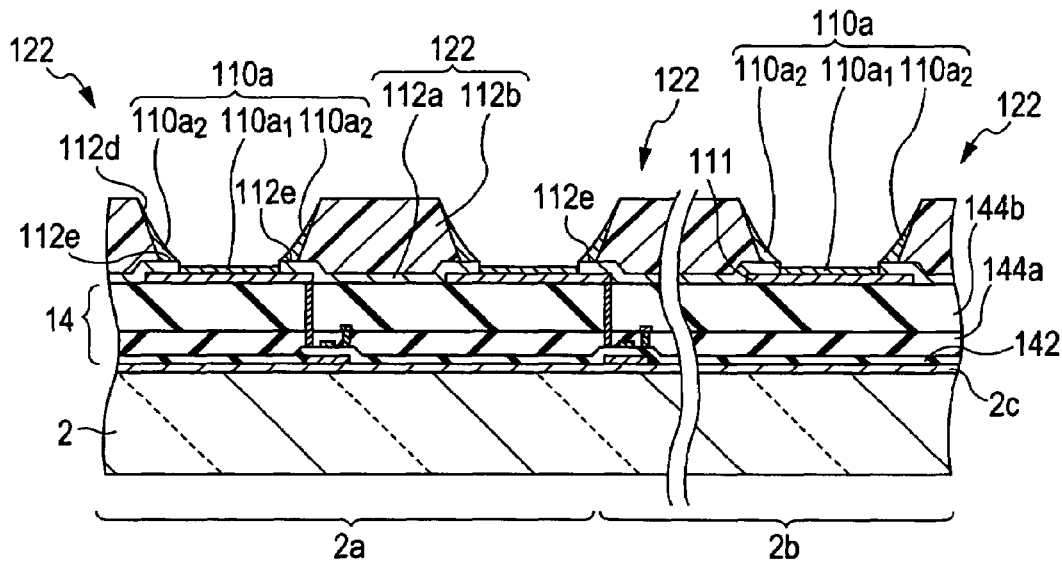
FIG. 20 is a process view illustrating the manufacturing method, which is subsequent to FIG. 19.
Figure 21:
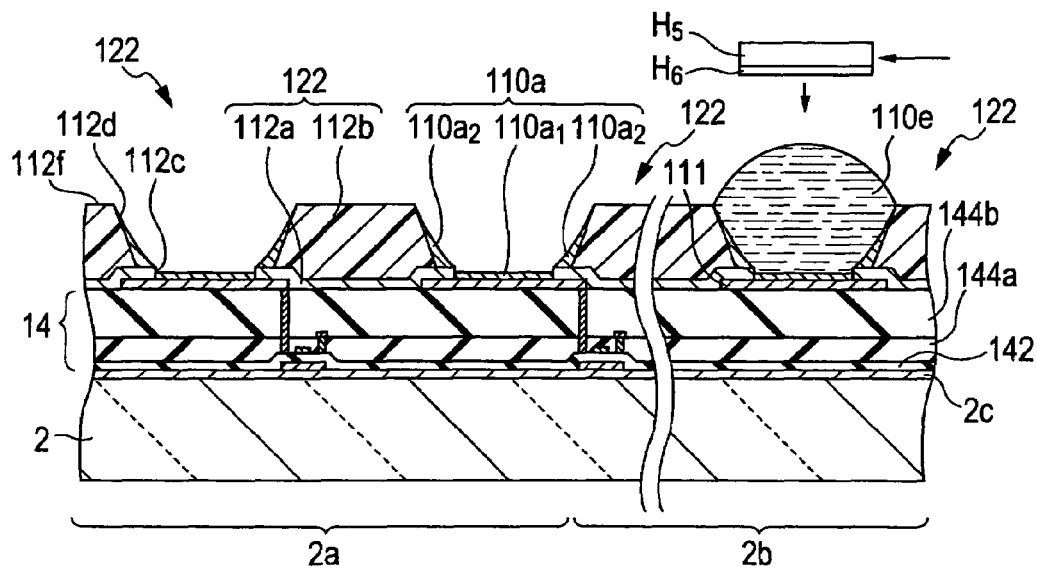
FIG. 21 is a process view illustrating the manufacturing method, which is subsequent to FIG. 20.

Next, a dry treatment is performed. By performing the dry treatment, the polar solvent contained in the first composition is evaporated to thereby form the hole injecting/transporting layer 110a, as shown in FIG. 20. When the dry treatment is performed, the evaporation of the polar solvent contained in the liquid droplets 110c of the first composition occurs mainly near the inorganic partition wall 112a and the organic partition wall 112b, and the hole injecting/transporting layer formation material is concentrated and educed while the evaporation of the polar solvent occurs. Accordingly, as shown in FIG. 20, the peripheral portion 110a2 made of the hole injecting/transporting layer formation material is formed on the first laminating portion 112e. The peripheral portion 110a2 is stuck fast to the wall (organic partition wall 112b) of the upper opening 112d. Further, the peripheral portion 110a2 is thin at a side close to the electrode surface 111a and is thick at a side far from the electrode surface 111a, that is, a side close to the organic partition wall 112b.

Further, the evaporation of the polar solvent occurs on the electrode surface 111a by the dry treatment, and accordingly, the flat portion 110a1 made of the hole injecting/transporting layer formation material is formed on the electrode surface 111a. Since the evaporation speed of the polar solvent on the electrode surface 111a is approximately uniform, the hole injecting/transporting layer formation material is uniformly concentrated on the electrode surface 111a, and accordingly, the flat portion 110a1 having a uniform thickness is formed. In such a manner, the hole injecting/transporting layer 110a composed of the peripheral portion 110a2 and the flat portion 110a1 is formed. Moreover, the hole injecting/transporting layer 110a may be formed on only the electrode surface 111a, without forming on the peripheral portion 110a2. Further, although the hole injecting/transporting layer 110a is also formed on the dummy region 2b in FIG. 20, it is not actually driven, that is, does not realize a function of injecting/transporting holes.

In the present embodiment, the amount of discharged solvent per unit area in the dummy region 2b is different from that in the display region 2a, as described above. Accordingly, in the dry treatment, the partial pressure of evaporating solvent molecules in the display region 2a does not become excessively large as compared to the partial pressure of evaporating solvent molecules in the dummy region 2b, and the evaporation speed of the solvent in the dummy region 2b can approximate to the evaporation speed of the solvent in the display region 2a. Then, by introduction of such a discharge condition, the evaporation speed of the solvent in the peripheral portion of the display region 2a approximates to that in the central portion of the display region 2a. Accordingly, the hole injecting/transporting layer 110a having a uniform thickness can be formed in the peripheral and central portions.

Moreover, the dry treatment is performed at a room temperature and a pressure of, for example, 133.3 Pa to 13.3 Pa (1 Torr to 0.1 Torr) under, for example, a nitrogen atmosphere.

Here, if the pressure is suddenly lowered, it is not preferable since the liquid droplets 110c of the first composition are suddenly boiled. Further, if the temperature is high, a flat film cannot be formed since the evaporation speed of the polar solvent is increased. Accordingly, a temperature range of from 30° C. to 80° C. is preferable.

After the dry treatment, it is preferable to remove the polar solvent or water remaining in the hole injecting/transporting layer 110a by performing a heat treatment at a temperature of 200° C. for 10 minutes under a nitrogen atmosphere, preferably, a vacuum atmosphere.

(4) Light Emitting Layer Formation Step

Next, the light emitting layer formation step is composed of a surface modification step, a light emitting layer formation material discharge step, and a dry step.

First, the surface modification step is performed in order to modify the surface of the hole injecting/transporting layer 110a. Next, like the above-described hole injecting/transporting layer formation step, a second composition containing the light emitting layer formation material is discharged onto the hole injecting/transporting layer 110a by the liquid droplet discharge method (light emitting formation material discharge step). Thereafter, the discharged second composition is subject to a dry treatment (and a heat treatment) to form the light emitting layer 110b on the hole injecting/transporting layer 110a (dry step). Moreover, in the light emitting formation material discharge step, just as the first composition is discharged, the amount (per unit area) of discharged solvent is relatively larger in the dummy region 2b than the display region 2a.

When the second composition containing the light emitting layer formation material is discharged, in a state where a discharge nozzle H6 faces the hole injecting/transporting layer 110a disposed within the lower and upper openings 112c and 112d, the second composition 110e is discharged while a liquid droplet discharge head H5 moves with respect to the base substrate 2. In this case, like the hole injecting/transporting layer formation step, the second composition 110e is discharged for one pixel region by a plurality of nozzles.

As a formation material of the light emitting layer 110b, for example, polyfluorene derivatives, polyphenylene derivatives, polyvinylcarzole, polythiophene derivatives can be used, and moreover, these high molecular material doped with phenylene pigment, coumarin pigment, or rhodamine pigment, for example, rubrene, perylene, 9,10-dephenylanthracene, tetraphenylbutadiene, nylonred, coumarin 6, quinacridone, or the like can be used.

Further, the solvent dissolving or dispersing the light emitting layer formation material does not preferably dissolve the hole injecting/transporting layer 110a. As such a solvent, for example, cyclohexyl benzene, dehydrobenzofuran, trimethylbenzene, tetramethylbenzene, or the like may be used. The use of such a solvent (nonpolar solvent) allows the second composition to be discharged without re-dissolving the hole injecting/transporting layer 110a.

The discharged second composition 110e is spread over the hole injecting/transporting layer 110a, filling the lower and upper openings 112c and 112d. On the other hand, even when the liquid droplets are discharged onto a surface 112f subject to the liquid repellency treatment, deviated from a predetermined discharge position, the surface 112f is not wetted by the liquid droplets, and the liquid droplets are rolled into the lower and upper openings 112c and 112d.

Figure 22:
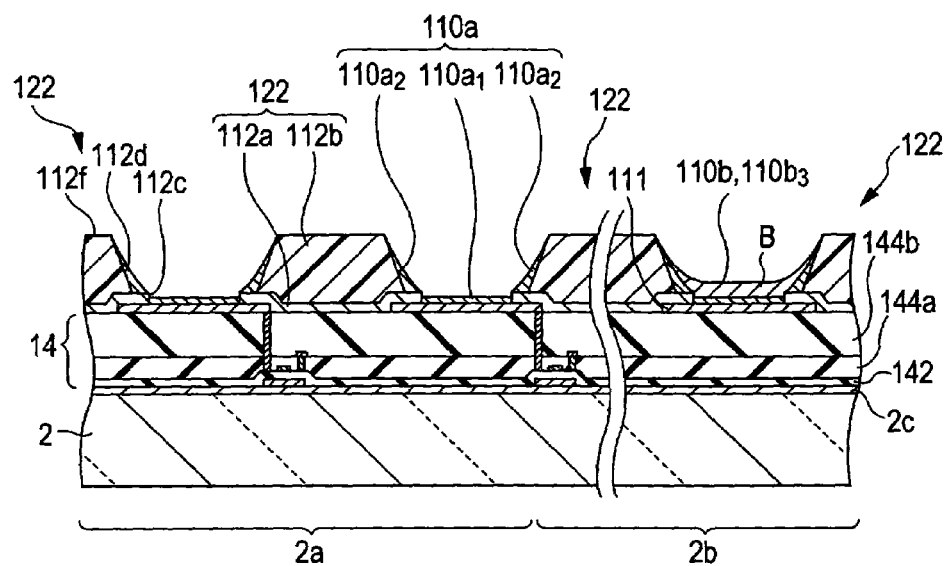
FIG. 22 is a process view illustrating the manufacturing method, which is subsequent to FIG. 21.

Next, after the second composition is all discharged at a predetermined position, a light emitting layer 110b3 is formed by drying the discharged second composition 110e. That is, the nonpolar solvent contained in the second composition is evaporated by the dry treatment to form a blue (B) light emitting layer 110b3, as shown in FIG. 22. Although only one blue light emitting layer is shown in FIG. 22, as apparent from FIG. 1 and other drawings, the light emitting elements are originally configured in the form of the matrix and a plurality of light emitting layers (corresponding to a blur color) is formed in pixel regions, which are not shown in FIG. 22.

In addition, even in the light emitting layer formation step, the amount of discharged solvent per unit area in the dummy region 2b is different from that in the display region 2a, as described above. Accordingly, in the dry step, the partial pressure of evaporating solvent molecules in the display region 2a does not become excessively large as compared to the partial pressure of evaporating solvent molecules in the dummy region 2b, and the evaporation speed of the solvent in the dummy region 2b can approximate to the evaporation speed of the solvent in the display region 2a. Then, by introduction of such a discharge condition, the evaporation speed of the solvent in the peripheral portion of the display region 2a approximates to that in the central portion of the display region 2a. Accordingly, the light emitting layer 110b3 having a uniform thickness can be formed in the peripheral and central portions.

Figure 23:
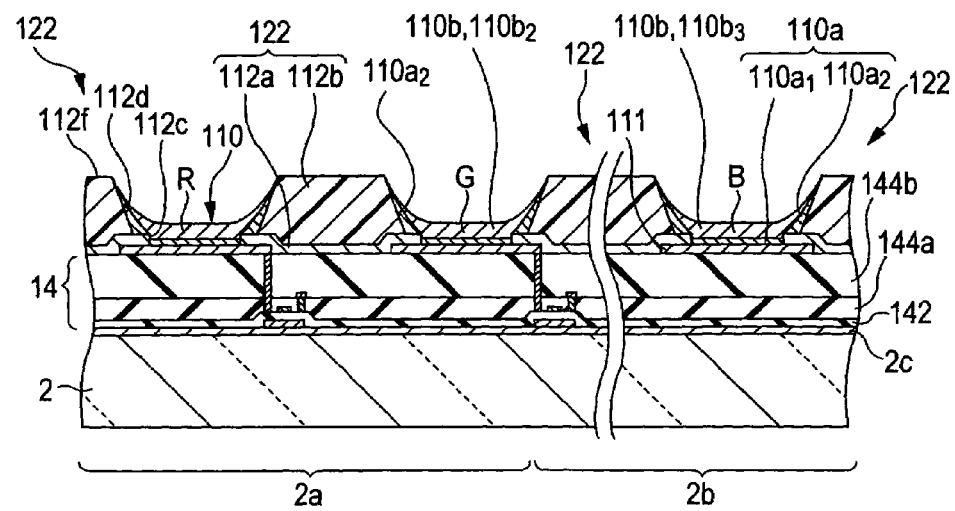
FIG. 23 is a process view illustrating the manufacturing method, which is subsequent to FIG. 22.

Subsequently, as shown in FIG. 23, a red (R) light emitting layer 110b1 is formed by the same step as in the above-described blue (B) light emitting layer 110b3, and, lastly, a green (G) light emitting layer 110b2 is formed by the same step. Moreover, a formation sequence of the light emitting layer 110b is not limited to the above-mentioned sequence, and may be optional. For example, the formation sequence may depend on a light emitting layer formation material.

Moreover, as dry conditions of the second composition of the light emitting layer, for example, the blue light emitting layer 110b3 is performed at a room temperature and a pressure of, for example, 133.3 Pa to 13.3 Pa (1 Torr to 0.1 Torr) for five to ten minutes under, for example, a nitrogen atmosphere. Here, if the pressure is excessively lowered, it is not preferable since the second composition is suddenly boiled. Further, if the temperature is high, the light emitting layer formation material may be much adhered to the wall of the upper opening 112d since the evaporation speed of the nonpolar solvent is increased. A temperature range of from 30° C. to 80° C. is preferable.

Further, the green and red light emitting layers 110b2 and 110b1 are preferable to be dried fast since they have many components of the light emitting layer formation material. For example, the layers 110b2 and 110b1 are preferably dried at a temperature of 40° C. for 5 to 10 minutes using a nitrogen jet. As other dry means, a far infrared ray irradiation method, a high temperature gas jet method, or the like may be exemplified. In such a manner, the hole injecting/transporting layer 110a and the light emitting layer 110b are formed on the pixel electrode 111.

(5) Counter Electrode (Cathode) Formation Step

Figure 24:
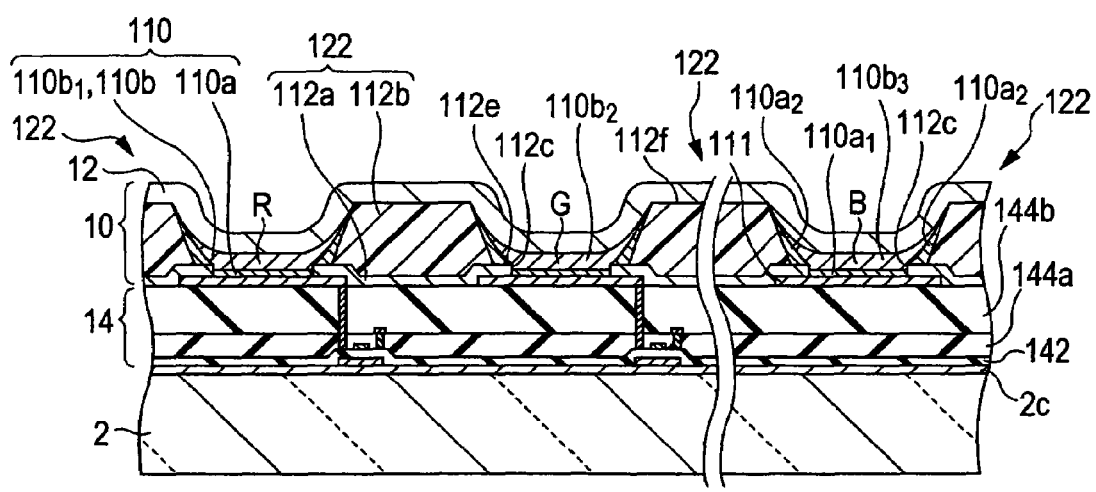
FIG. 24 is a process view illustrating the manufacturing method, which is subsequent to FIG. 23.

Next, in the counter electrode formation step, as shown in FIG. 24, the cathode (counter electrode) 12 is formed on the entire surface of the light emitting 110b and the organic partition wall 112b. The cathode 12 may be formed by laminating a plurality of materials. For example, a material having a small work function, such as Ca, Ba, or the like, is preferably formed at a side close to the light emitting layer. Further, depending on the material, a thin lithium fluoride may be formed on a lower layer. Further, a material having work function larger than that of the lower layer such as aluminum may be used for an upper layer (sealing side).

The cathode 12 is preferably formed by, for example, a deposition method, a sputtering method, a CVD method, or the like. Particularly, it is more preferable to form the cathode 12 using the deposition method since this method can prevent the light emitting layer 110*b* from being damaged due to heat. Further, the lithium fluoride may be formed on only the light emitting layer 110*b* and may be formed corresponding to a predetermined color. For example, the lithium fluoride may be formed on only the blue (B) light emitting layer 110*b*3. In this case, an upper cathode layer made of calcium contacts the remaining red (R) and green (G) light emitting layers 110*b*1 and 110*b*2.

An Al layer, an Ag layer, or the like formed by a deposition method, a sputtering method, a CVD method, or the like is preferably used on an upper side of the cathode 12. Further, its thickness is preferably in a range of from 100 nm to 1000 nm, more preferably, 200 nm to 500 nm. Further, a protective layer, such as $SiO_2$, SiN, or the like, for anti-oxidation may be provided on the cathode 12.

(6) Sealing Step

Finally, the sealing step is a step to seal the base substrate 2 on which the light emitting element containing the functional layer 110 is formed and the sealing substrate (FIG. 2) by means of the sealing resin 603. For example, the entire surface of the base substrate 2 is coated with the sealing resin 603 such as a thermosetting resin or an ultraviolet curing resin, and then, the sealing substrate is laminated on the sealing resin. By the sealing step, the sealing portion 3 is formed on the base substrate 2.

It is preferable to perform the sealing step in an inert gas atmosphere such as nitrogen gas, argon gas, or helium gas. Air is not preferable since the cathode 12 may be oxidized as water or oxygen penetrates into the negative electrode 12 through defects such as pin holes, which may occur in the cathode 12.

Further, by connecting the cathode 12 to a wiring 5*a* of the substrate 5 and connecting wiring lines of the circuit element portion 14 to the driving IC 6, the display device 1 of the present embodiment can be attained.

Figure 25A:
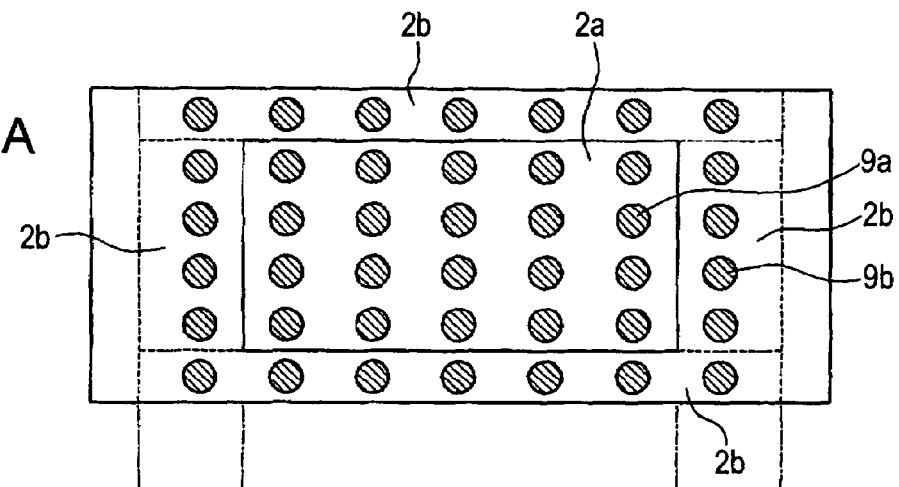
FIG. 25A is a plan view showing an aspect in which liquid droplets are discharged.
Figure 25B:
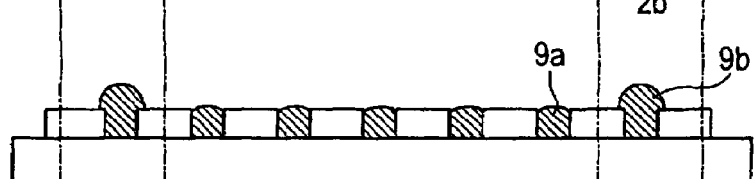
FIG. 25B is a cross-sectional view showing the aspect in which liquid droplets are discharged.
Figure 25C:
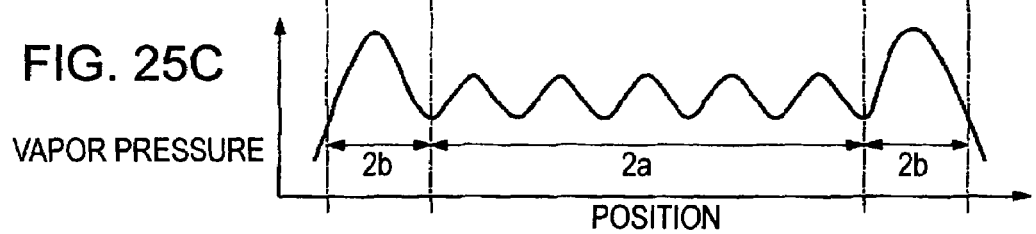
FIG. 25C is a graph showing a value of a vapor pressure.

As apparent from the above description, according to the manufacturing method of the display device 1 of the present embodiment, the liquid droplet discharge method is adopted in the step of forming the functional layer 110 of the light emitting element, and, for the volume (per unit area) of the discharged solvent, the amount of discharged solvent is relatively larger in the dummy region 2*b* than the display region 2*a*. Specifically, as shown in FIGS. 25A to 25C, the amount of first composition (second composition) 9*b* dropped into the dummy region 2*b* per unit area is larger than the amount of first composition (second composition) 9*a* dropped into the display region 2*a* per unit area. As a result, the amount of the solvent is relatively large in the dummy region 2*b* (FIGS. 25A and 25B).

Accordingly, as shown in FIG. 25C, the vapor pressure of evaporating solvent molecules in the dummy region 2*b* becomes larger than the vapor pressure of evaporating solvent molecules in the display region 2*a*, and further, the evaporation speed of the solvent in the peripheral portion of the display region 2*a* can approximate to the evaporation speed of the solvent in the central portion of display region 2*a*. As a result, the hole injecting/transporting layer 110*b* or the light emitting layer 110*c* (functional layer 110) having a uniform and equal film thickness can be formed in the peripheral and central portions of the display region 2*a*. Then, in this case, irrespective of the central and peripheral portions, the organic EL device 1 having small irregularity of element characteristics (display characteristics) and excellent reliability can be provided.

Hereinafter, a modification of the discharge aspect of the liquid droplets when the hole injecting/transporting layer 110*b* or the light emitting layer 110*c* (functional layer 110) is formed will be described. In the following description, the amount of discharge is referred to as the amount of discharge per unit area.

Figure 26A:
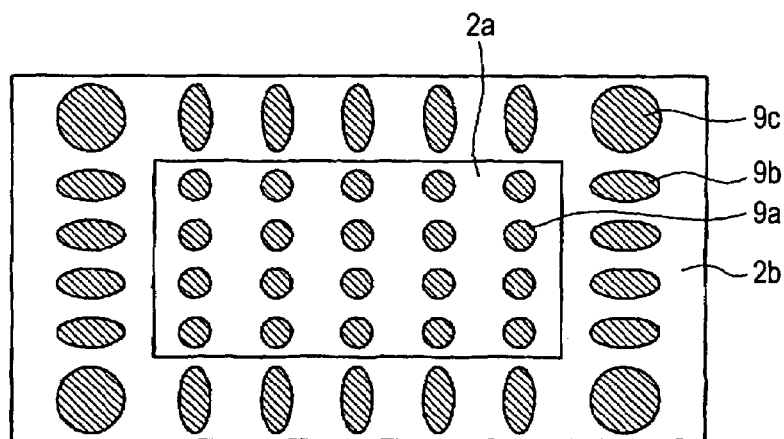
FIG. 26A is a plan view showing a modification in which liquid droplets are discharged.
Figure 26B:
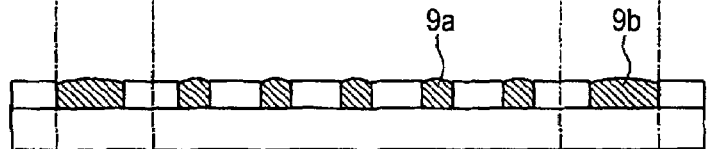
FIG. 26B is a cross-sectional view showing the modification in which liquid droplets are discharged.
Figure 26C:
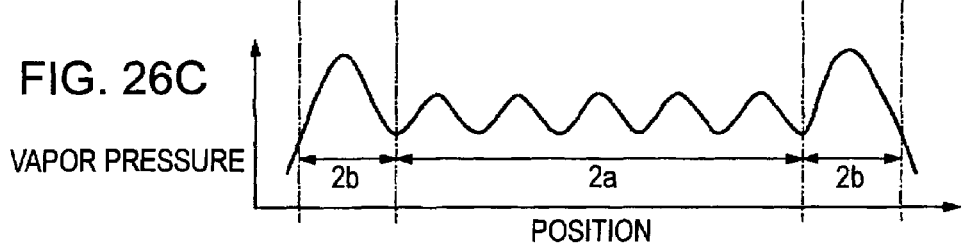
FIG. 26C is a graph showing a value of a vapor pressure.

First, as shown in FIGS. 26A to 26C, by making the area of the discharge region (that is, the area of the opening surrounded by the partition wall 122) in the dummy region 2*b* larger than the area of the discharge region in the display region 2*a*, the amount of discharge can become relatively large in the dummy region 2*b*. Particularly, it is preferable to make the amount of discharge larger in a dummy region 2*c* at an edge of the rectangular display region 2*a* than the other dummy region 2*b*.

Figure 27A:
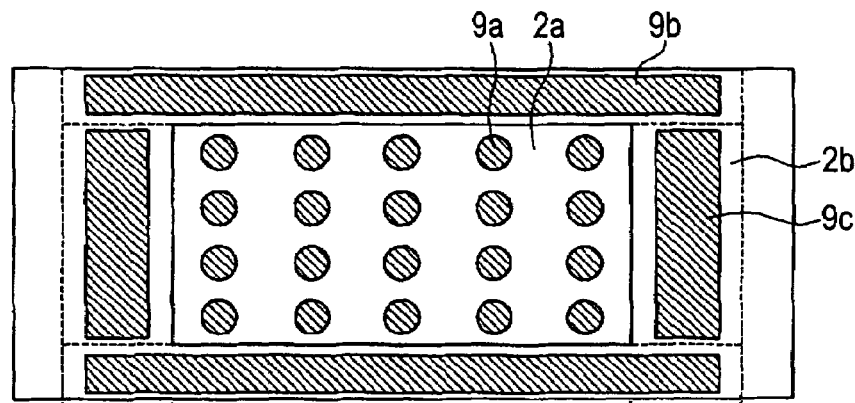
FIG. 27A is a plan view showing another modification in which liquid droplets are discharged.
Figure 27B:
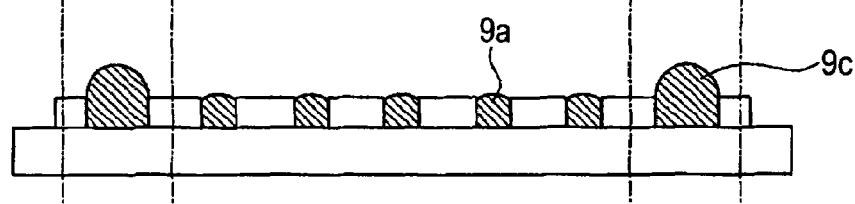
FIG. 27B is a cross-sectional view showing another modification in which liquid droplets are discharged.
Figure 27C:
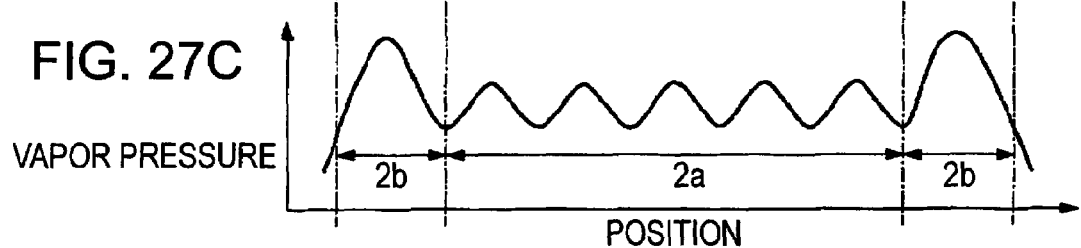
FIG. 27C is a graph showing a value of a vapor pressure.
Figure 28A:
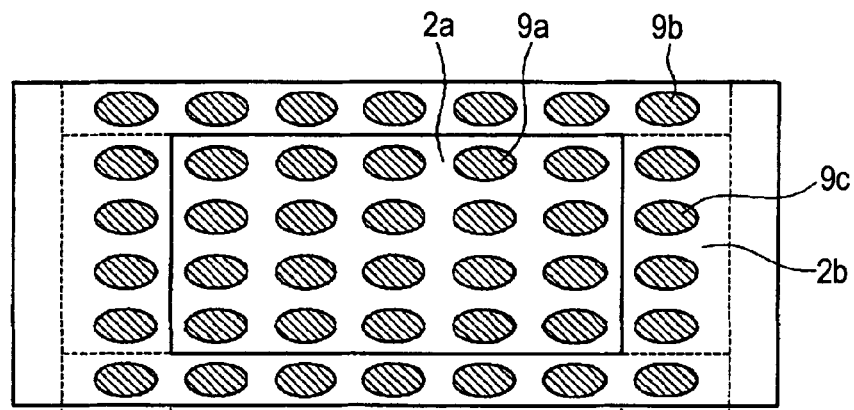
FIG. 28A is a plan view showing still another modification in which liquid droplets are discharged.
Figure 28B:
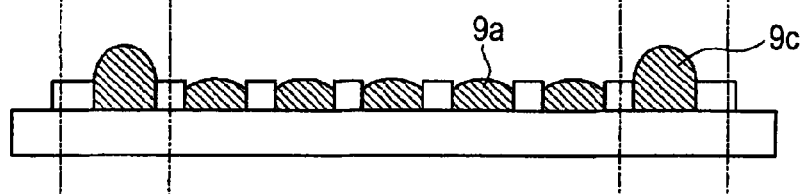
FIG. 28B is a cross-sectional view showing still another modification in which liquid droplets are discharged.
Figure 28C:
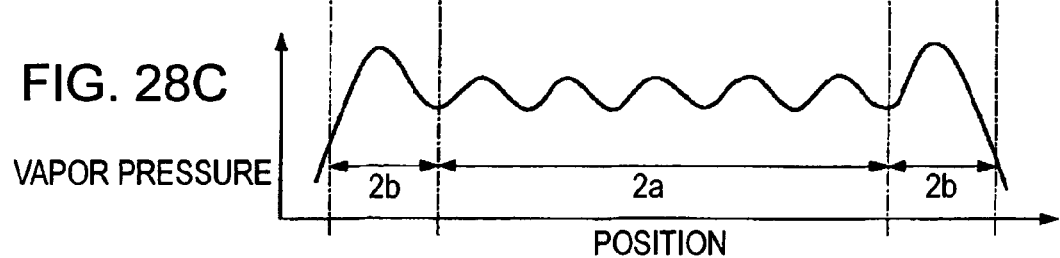
FIG. 28C is a graph showing a value of a vapor pressure.

Further, as shown in FIGS. 27A to 27C, the first composition (second composition) 9*b* and 9*c* may be discharged over the substantially entire range of the dummy region 2*b*. In this case, the amount of discharge in the dummy region 2*b* can be surely larger than the amount of discharge in the display region 2*a*. Particularly, in the case where the display region 2*a* is rectangular, it is preferable to make the amount of discharge larger in a dummy region A in the short side direction than a dummy region B in the long side direction. Accordingly, the vapor pressure of the evaporating solvent molecules can be even uniform in the base substrate. Moreover, although the liquid droplets are not discharged over the entire range of the dummy region 2*b*, as shown in FIGS. 28A to 28C, even when the liquid droplets are discharged onto only a region surrounded by a partition wall (not shown), in the case where the display region 2*a* is rectangular, it is preferable to make the amount of discharge larger in the dummy region A in the short side direction than the dummy region B in the long side direction.

Figure 29:
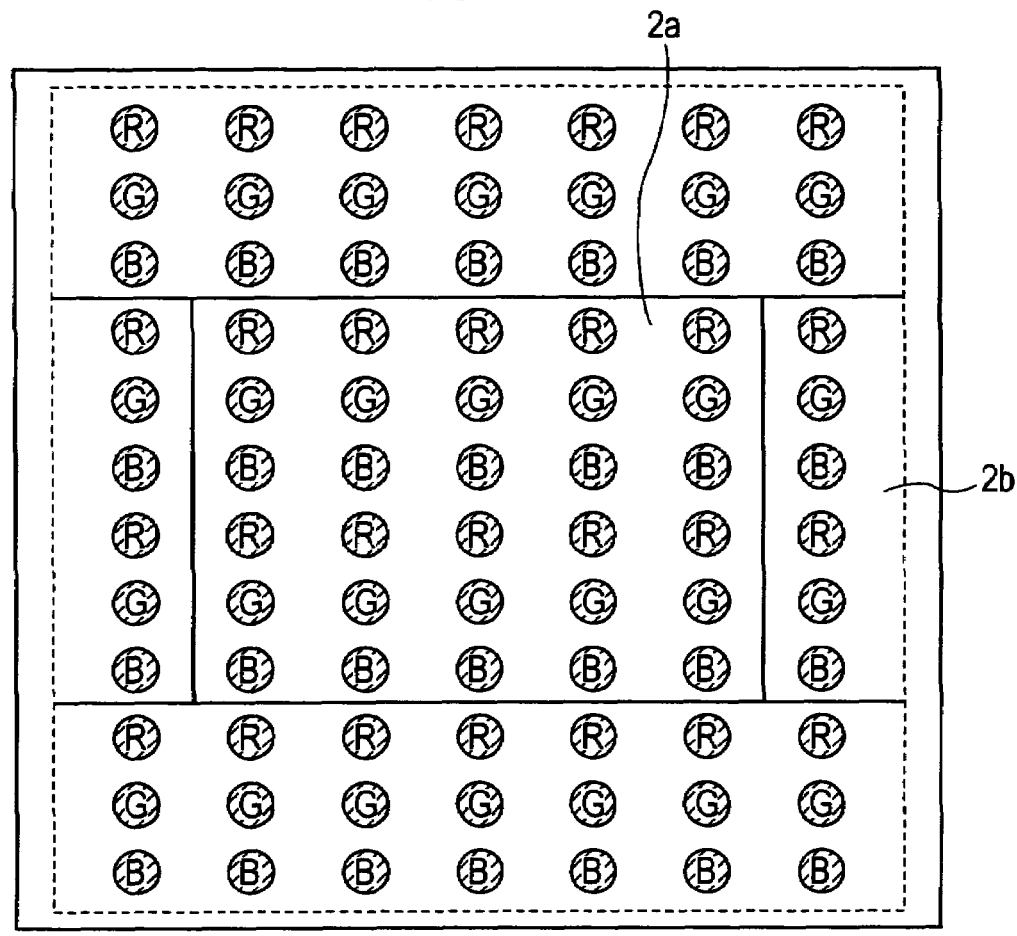
FIG. 29 is a plan view showing a further modification in which liquid droplets are discharged.

Further, as shown in FIG. 29, when the display region 2*a* is rectangular and the light emitting layers 110*c* having the same color (for example, R (red), G (green), or B (blue)) are arranged in the long side direction, it is preferable to make the amount of discharge larger in the dummy region A in the short side direction than the dummy region B in the long side direction. Accordingly, for example, when the solvent is dried for each color, the vapor pressure of the evaporating solvent molecules can be even uniform in the base substrate.

Further, as shown in FIGS. 31A to 31C, the area of the discharge region (that is, the area of the opening surrounded by the partition wall 122) in the dummy region 2*b* can be made larger than the area of the discharge region in the display region 2*a*. In this case, by making the amount of discharge larger in the dummy region 2*b* larger than the amount of discharge in the display region 2*a*, the vapor pressure of the evaporating solvent molecules in the dummy region 2*b* can be increased, and further, the vapor pressure of the evaporating solvent molecules in the display region 2*a* can be uniform in the base substrate.

Figure 32A:
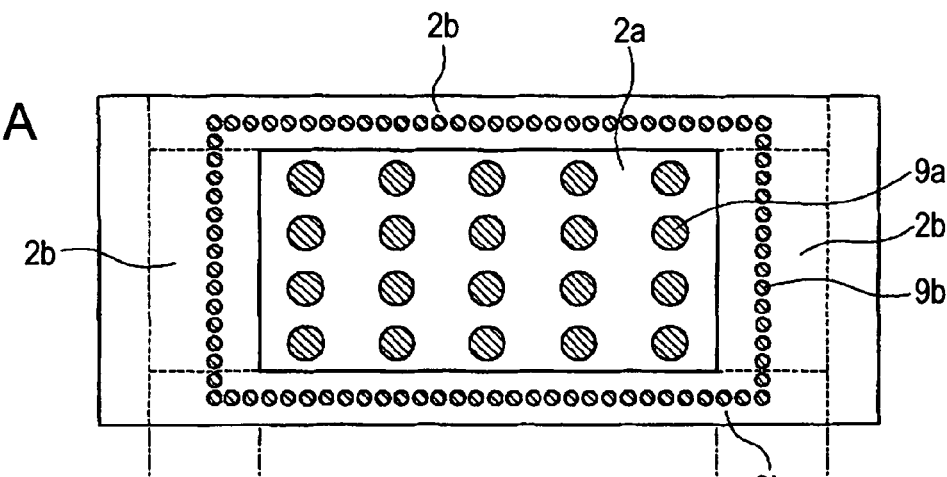
FIG. 32A is a plan view showing another modification in which liquid droplets are discharged.
Figure 32B:
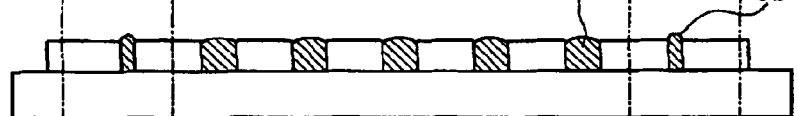
FIG. 32B is a cross-sectional view showing another modification in which liquid droplets are discharged.
Figure 32C:
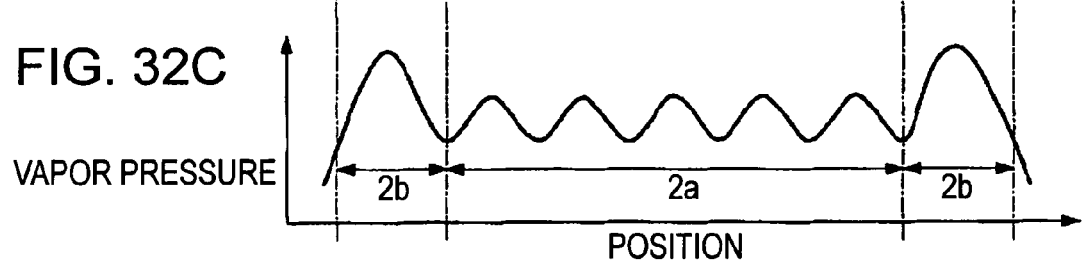
FIG. 32C is a graph showing a value of a vapor pressure.

Further, as shown in FIGS. 32A to 32C, the area of the discharge region (that is, the area of the opening surrounded by the partition wall 122) in the dummy region 2*b* can be made smaller than the area of the discharge region in the display region 2*a* such that discharge regions of the dummy region 2*b* are compactly arranged. In this case, by making the amount of discharge larger in the dummy region 2*b* larger than the amount of discharge in the display region 2*a*, the vapor pressure of the evaporating solvent molecules in the dummy region 2b can be increased, and further, the vapor pressure of the evaporating solvent molecules in the display region 2a can be uniform in the base substrate.

Figure 33A:
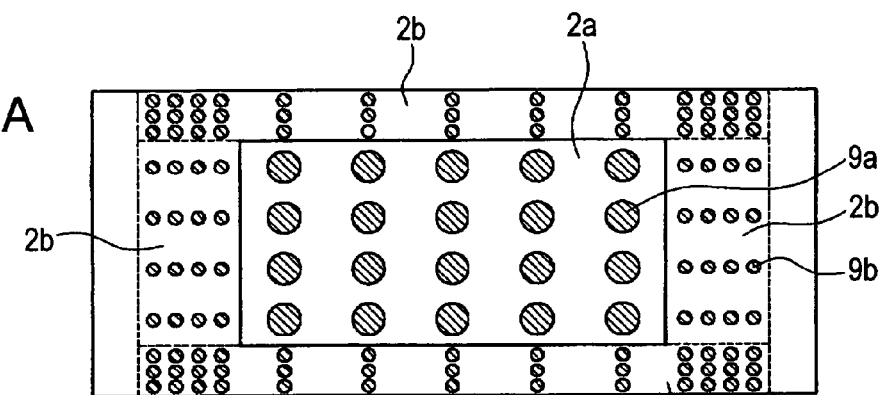
FIG. 33A is a plan view showing still another modification in which liquid droplets are discharged.
Figure 33B:
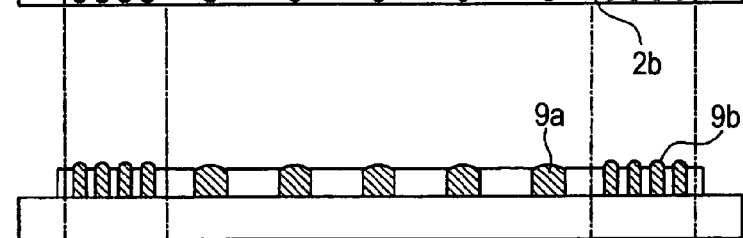
FIG. 33B is a cross-sectional view showing still another modification in which liquid droplets are discharged.
Figure 33C:
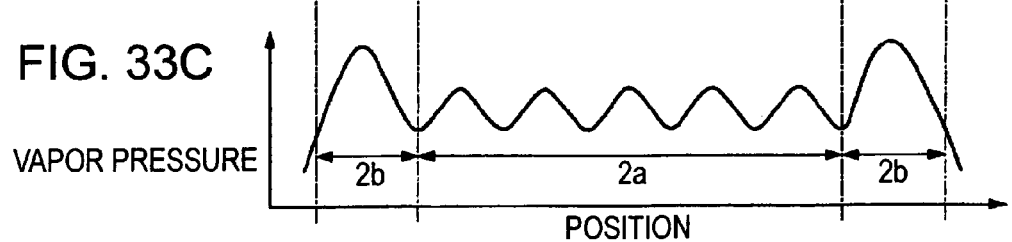
FIG. 33C is a graph showing a value of a vapor pressure.

Further, as shown in FIGS. 33A to 33C, when the area of the discharge region (that is, the area of the opening surrounded by the partition wall 122) in the dummy region 2b can be made smaller than the area of the discharge region in the display region 2a such that discharge regions of the dummy region 2b are compactly arranged, the discharge region of the dummy region 2b can be formed in the same column and/or row as the discharge region of the display region 2a. In this case, by making the amount of discharge larger in the dummy region 2b larger than the amount of discharge in the display region 2a, the vapor pressure of the evaporating solvent molecules in the dummy region 2b can be increased, and further, the vapor pressure of the evaporating solvent molecules in the display region 2a can be uniform in the base substrate. Also, in this case, since the discharge is performed for the same column and/or row, the discharge step is very convenient as compared to the example of FIGS. 32A to 32C.

As apparent from the above description, although the method according to the present invention is adopted when the functional layer 110 is formed in the present embodiment, the present invention may be adopted for the color filter substrate used in a liquid crystal device and the like. Specifically, in a manufacturing process of a color filter substrate having a functional region (corresponding to the display region 2a in the present embodiment) functioning as a color filter and selectively transmitting predetermined color light and a non-functional region (corresponding to the dummy region 2b in the present embodiment) other than the functional region, the composition (liquid material) in which coloring materials constituting colored layers are dissolved or dispersed in the solvent is discharged onto the substrate by the liquid droplet discharge method. Further, in the discharge step, like the above-described formation step of the functional layer 110, when the amount of solvent discharged onto the non-functional region per unit area is larger than the amount of solvent discharged onto the functional region per unit area, the same effect as the above embodiment can be achieved, and, as a result, a color filter substrate having a uniform film thickness in the functional region can be manufactured.

Second Embodiment

Figure 30:
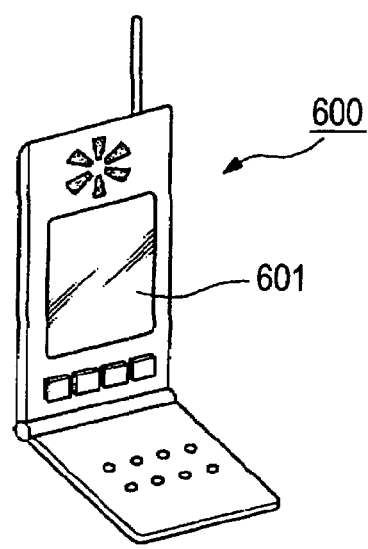
FIG. 30 is a perspective view showing an electronic apparatus according to a second embodiment of the invention.

Next, an example of an electronic apparatus having the display device according to the first embodiment will be described. FIG. 30 is a perspective view showing an example of a cellular phone. In FIG. 30, reference numeral 600 denotes a cellular phone main body and reference numeral 601 denotes a display unit using the display device 1. Since such an electronic apparatus has the display unit using the display device 1 according to the first embodiment and characteristics of the display device 1, small irregularity of display and excellent display quality can be achieved.

What is claimed is:

1. A method of manufacturing an electro-optical device which has a functional region in which electro-optical elements of pixels function and a non-functional region which is formed around the functional region, the method comprising:
    forming liquid holding regions in the functional region and in the non-functional region, an area of the liquid holding region in the functional region being formed larger than an area of the liquid holding region in the non-functional region:
    discharging, into the liquid holding region in the functional region and in the non-functional region, a liquid material, in which functional materials constituting the electro-optical elements are dissolved or dispersed into a solvent, with a liquid droplet discharge method,
    wherein, in the discharging of the liquid material, the liquid material is discharged onto the functional region and the liquid material or the solvent is discharged onto the non-functional region, and
    the amount of the solvent discharged onto the non-functional region per unit area is larger than the amount of the solvent discharged onto the functional region per unit area.

2. The method of manufacturing an electro-optical device according to claim 1,
    wherein the functional region is rectangular in plan view and a density of the liquid holding region in the non-functional region is different in the longitudinal and traverse directions of the functional region.

3. The method of manufacturing an electro-optical device according to claim 1,
    wherein the functional region is rectangular in plan view and the non-functional region includes a first non-functional region formed in a traverse direction of the functional region and a second non-functional region formed in a longitudinal direction of the functional region, wherein in the discharging of the liquid material, the amount of the solvent discharged onto the first non-functional region per unit area is larger than the amount of the solvent discharged onto the second non-functional region per unit area.

4. The method of manufacturing an electro-optical device according to claim 1, further comprising: forming the liquid holding region of the non-functional region in a substantially rectangular shape along a side of the functional region.

* * * * *